US012710853B2

(12) United States Patent
Jang et al.

(10) Patent No.: US 12,710,853 B2
(45) Date of Patent: Aug. 18, 2026

(54) ELECTRONIC DEVICE

(71) Applicant: Samsung Display Co., Ltd., Yongin-si (KR)

(72) Inventors: Seokwon Jang, Yongin-si (KR); Hyunjae Na, Yongin-si (KR); Youngjin Lee, Yongin-si (KR); Sunhaeng Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/035,656

(22) Filed: Jan. 23, 2025

(65) Prior Publication Data

US 2025/0238108 A1 Jul. 24, 2025

(30) Foreign Application Priority Data

Jan. 24, 2024 (KR) ........................ 10-2024-0010789

(51) Int. Cl.
*G06F 3/046* (2006.01)
*G06F 3/041* (2006.01)
(Continued)

(52) U.S. Cl.
CPC ............ *G06F 3/046* (2013.01); *G06F 3/0412* (2013.01); *G06F 3/044* (2013.01); *H10K 59/40* (2023.02);
(Continued)

(58) Field of Classification Search
CPC ........ G06F 3/046; G06F 3/0412; G06F 3/044; G06F 2203/04102; G06F 2203/04111;
(Continued)

(56) References Cited

U.S. PATENT DOCUMENTS 11,314,367 B2 4/2022 Jung
11,662,780 B2 5/2023 Park
(Continued)

FOREIGN PATENT DOCUMENTS

KR 10-2020-0052621 A 5/2020
KR 10-2021-0096725 8/2021
(Continued)

OTHER PUBLICATIONS

International Search Report dated Apr. 22, 2025, corresponding to WO Patent Application PCT/KR2025/000871, 9 pages.

*Primary Examiner* — Hong Zhou
(74) *Attorney, Agent, or Firm* — Womble Bond Dickinson (US) LLP

(57) ABSTRACT

An electronic device includes a display module and a digitizer including a folding portion, a first non-folding portion, and a second non-folding portion spaced apart from the first non-folding portion in a second direction and including a base portion and sensing coils in the base portion. The folding portion includes a center portion including first holes and overlapping an active area and an outer portion including second and third holes each including a first portion and a second portion, having different shapes, and alternately arranged with each other in the second direction. The first portion of each of the second holes has a convex shape in a direction away from the center portion in a plan view, and the first portion of each of the third holes has a convex shape in a direction approaching the center portion in the plan view.

19 Claims, 20 Drawing Sheets

(51) Int. Cl.
*G06F 3/044* (2006.01)
*H10K 59/40* (2023.01)
*H10K 102/00* (2023.01)

(52) U.S. Cl.
CPC .............. *G06F 2203/04102* (2013.01); *G06F 2203/04111* (2013.01); *H10K 2102/311* (2023.02)

(58) Field of Classification Search
CPC . G06F 2203/04106; G06F 2203/04112; G06F 3/0445; G06F 3/0446; H10K 59/40; H10K 2102/311
See application file for complete search history.

(56) References Cited

U.S. PATENT DOCUMENTS

| | | | | |
|---|---|---|---|---|
| 11,899,493 | B2 | 2/2024 | Kishimoto et al. | |
| 12,289,981 | B2 | 4/2025 | Kim et al. | |
| 2021/0153363 | A1* | 5/2021 | Cao | H10K 77/111 |
| 2021/0233447 | A1* | 7/2021 | Park | G06F 1/1616 |
| 2023/0082293 | A1* | 3/2023 | Lv | G06F 1/1656 361/679.01 |
| 2023/0289021 | A1* | 9/2023 | Jeon | G06F 3/046 |

FOREIGN PATENT DOCUMENTS

| | | | |
|---|---|---|---|
| KR | 10-2021-0133342 | A | 11/2021 |
| KR | 10-2022-0095572 | A | 7/2022 |
| KR | 10-2023-0049573 | A | 4/2023 |
| KR | 10-2023-0113438 | A | 7/2023 |

* cited by examiner

AA'
DP-DA
DP-TA
PA
BT BL
DP-TA
PX2-B PX2-G PX2-R
PX2
LA
DP-DA
LA NLA
PX1-B
PX1-R
PX1-G
PX1
DR1
DR2
DR3

DD
DR3
DR1
DR2
AA1
NFA10
FA0
NFA20
BA
AA2
BP
PF
AL1
UTG
AL2
DL
AL3
WM
UM
DM
PPL
AL5
BRL
AL6-1
DTM-1
DTM-F
AL7-1
ML1
AL8-1
CS1
AL9-1
AS-1
LM
MSM
LTH
HRP1
MP1
GP
D6
HRP2
MP2
AS-2
AL4-1
PPL-1
AL6-2
DTM-2
HL
AL7-2
ML2
AL8-2
CS2
AL9-2
BPL
DIC
FCB
AL4-2
PPL-2
AL8-1 AL8-2 AL8
AL9-1 AL9-2 AL9
AL4-1 AL4-2 AL4
AL6-1 AL6-2 AL6
AL7-1 AL7-2 AL7
HRP-1 HRP-2 HRP
ML1 ML2 ML
MP1 MP2 MP
DTM-F DTM-1 DTM-2 DTM
CS1 CS2 CS
AS-1 AS-2 AS

ELECTRONIC DEVICE

CROSS-REFERENCE TO RELATED APPLICATION

The present application claims priority to and the benefit of Korean Patent Application No. 10-2024-0010789, filed on Jan. 24, 2024, in the Korean Intellectual Property Office, the entire disclosure of which is incorporated herein by reference.

BACKGROUND

1. Field

Aspects of some embodiments of the present disclosure relate to an electronic device.

2. Description of Related Art

In the information society, electronic devices are becoming increasingly important as media for transmission of visual information. An electronic device may be activated in response to electrical signals applied thereto. An electronic device may include a display layer that displays images and a digitizer, e.g., a stylus pen, that senses external inputs applied thereto from the outside.

The digitizer of the electronic device may include various sensing coils to be activated by the electrical signals. Areas in which the sensing coils are activated respond to the external signals.

The above information disclosed in this Background section is only for enhancement of understanding of the background and therefore the information discussed in this Background section does not necessarily constitute prior art.

SUMMARY

Aspects of some embodiments of the present disclosure relate to an electronic device including a digitizer. For example, aspects of some embodiments of the present disclosure relate to an electronic device including a digitizer that includes a folding portion with relatively improved sensing performance.

Aspects of some embodiments of the present disclosure include an electronic device including a display module including an active area through which an image is provided and a peripheral area adjacent to the active area and a digitizer under the display module, including a folding portion folded with respect to a folding axis extending in a first direction, a first non-folding portion, and a second non-folding portion spaced apart from the first non-folding portion with the folding portion interposed therebetween in a second direction intersecting the first direction, and including a base portion and sensing coils in the base portion. The folding portion includes a center portion including first holes and overlapping the active area and an outer portion extending from the center portion toward a direction parallel to the first direction and including second holes each including a first portion and a second portion and third holes each including a first portion and a second portion. The second and third holes have different shapes and alternately arranged with each other in the second direction. The first portion of each of the second holes has a convex shape in a direction away from the center portion when viewed in a plane (e.g., in a plan view), and the first portion of each of the third holes has a convex shape in a direction approaching the center portion when viewed in the plane (e.g., in a plan view).

According to some embodiments, the second portion of each of the second holes surrounds a portion of the first hole adjacent to a boundary between the center portion and the outer portion.

According to some embodiments, the second portion of each of the third holes is at an edge of the outer portion to define an open opening.

According to some embodiments, a width between side surfaces of the outer portion, which define the second portion of each of the third holes, is uniform in the second direction.

According to some embodiments, the first holes include first group holes extending in the first direction and arranged in the second direction and second group holes alternately arranged with the first group holes, shifted from the first group holes to the first direction, extending in the first direction, and arranged in the second direction.

According to some embodiments, the sensing coils include non-folding coils in the first non-folding portion and the second non-folding portion, center lines in the center portion, and outer lines in the outer portion, each of the outer lines includes a first line that is linear, a second line with a predetermined curvature, a third line that is linear, and a fourth line with a predetermined curvature, the first line is between the first portion of one second hole among the second holes and the first portion of one third hole among the third holes, the second line is adjacent to a convex portion of the first portion of the third hole, the third line is between the first portion of the one third hole among the third holes and the first portion of another second hole among the second holes, and the fourth line is adjacent to a convex portion of the first portion of the second hole.

According to some embodiments, a width of a portion between the first portion of the second hole and the first portion of the third hole in the outer portion along a direction to which the first lines are spaced apart from each other is equal to or greater than 0.2 mm and equal to or smaller than 0.5 mm.

According to some embodiments, the outer lines include first, second, and third outer lines spaced apart from each other and sequentially arranged, and a center distance from a center of a radius of curvature of a portion with a maximum curvature of the first portion of the second hole to the second outer line is equal to or greater than 0.3 mm and equal to or smaller than 0.8 mm.

According to some embodiments, a portion of the outer portion on which the first line is located, which is linear, has an extension distance in a direction in which the first line extends, and a ratio of the extension distance to the center distance is equal to or greater than 1.

According to some embodiments, a ratio of the width to the center distance is 0.5.

According to some embodiments, the base portion includes a base layer including an upper surface facing the display module and a lower surface opposite to the upper surface, a first upper base layer on the upper surface of the base layer, a second upper base layer on an upper surface of the first upper base layer, a first lower base layer on the lower surface of the base layer, and a second lower base layer on a lower surface of the first lower base layer.

According to some embodiments, the outer lines are on at least three layers among the second lower base layer, the first lower base layer, the base layer, and the first upper base layer.

According to some embodiments, the outer lines on one of the second lower base layer, the first lower base layer, the base layer, and the first upper base layer include first, second, and third lines spaced apart from each other and sequentially arranged, and at least nine outer lines are in the outer portion.

According to some embodiments, each of the sensing coils includes one of copper, and each of the second lower base layer, the first lower base layer, the base layer, the first upper base layer, and the second upper base layer includes a matrix including a filler and a reinforced fiber composite in the matrix and including one of a glass fiber and a carbon fiber.

According to some embodiments, the matrix includes at least one of epoxy, polyester, polyamide, polycarbonate, polypropylene, polybutylene, or vinyl ester.

According to some embodiments, the filler includes at least one of silica, barium sulphate, sintered talc, barium titanate, titanium oxide, clay, alumina, mica, boehmite, zinc borate, or zinc tin oxide.

According to some embodiments, each of the non-folding coils forms an open loop that rotates at least twice.

According to some embodiments, portions of the non-folding coils which rotate twice and intersect each other are connected to a bridge pattern on a different layer among the second lower base layer, the first lower base layer, the base layer, the first upper base layer, and the second upper base layer through a contact hole.

According to some embodiments, two center lines are between the first holes adjacent to each other in the plan view.

According to some embodiments, the display module includes a display panel providing the image and an input sensor directly on the display panel and sensing an external input by a capacitive method.

According to some embodiments, the digitizer senses an external input by an electromagnetic resonance method.

According to some embodiments, the sensing sensitivity of the outer portion and the sensing sensitivity of the center portion in the folding portion may be relatively uniformly maintained, and instances of cracks occurring in the outer lines in the outer portion of the folding portion may be prevented or reduced. Accordingly, the sensing sensitivity of the digitizer included in the electronic device may be relatively improved.

BRIEF DESCRIPTION OF THE DRAWINGS

The above and other aspects of some embodiments the present disclosure will become readily apparent by reference to the following detailed description when considered in conjunction with the accompanying drawings wherein.

DETAILED DESCRIPTION

Figure 1A:
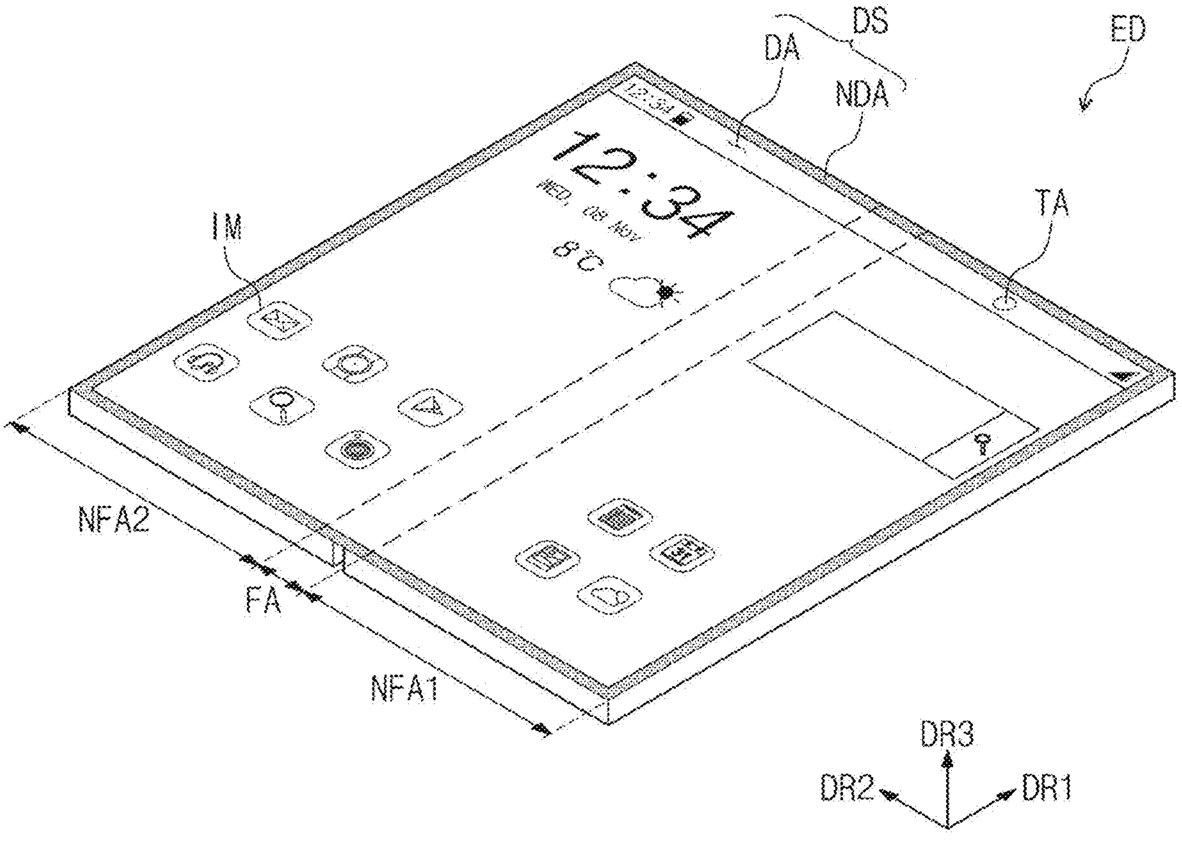
FIGS. 1A to 1C are perspective views of an electronic device according to some embodiments of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, aspects of some embodiments of the present disclosure will be described in more detail with reference to accompanying drawings.

Figure 1B:
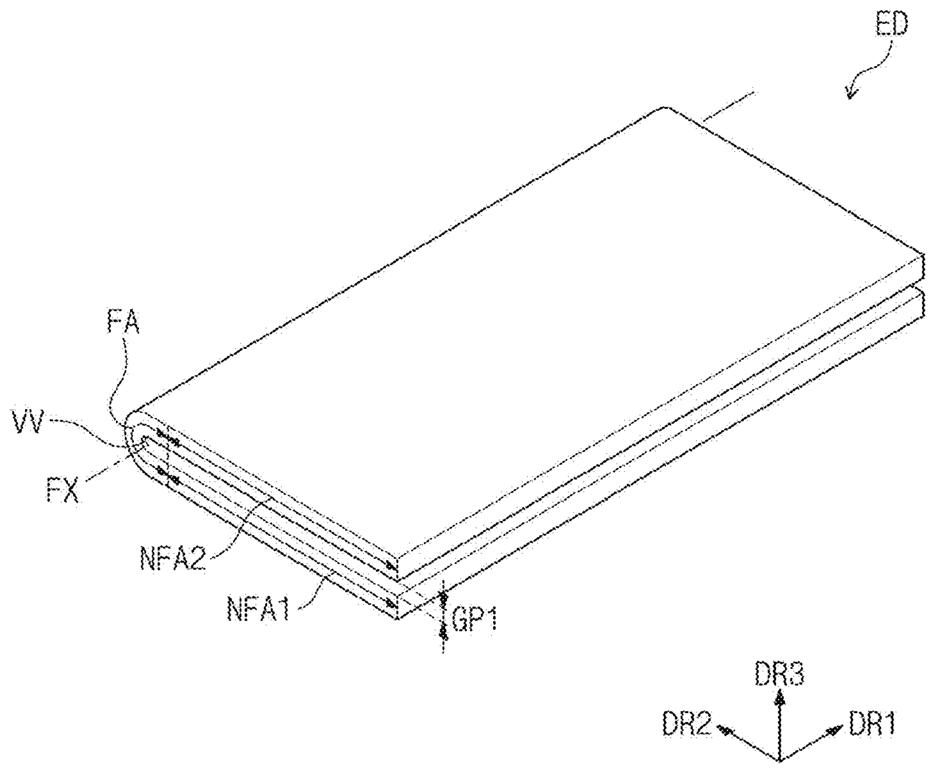
Figure 1C:
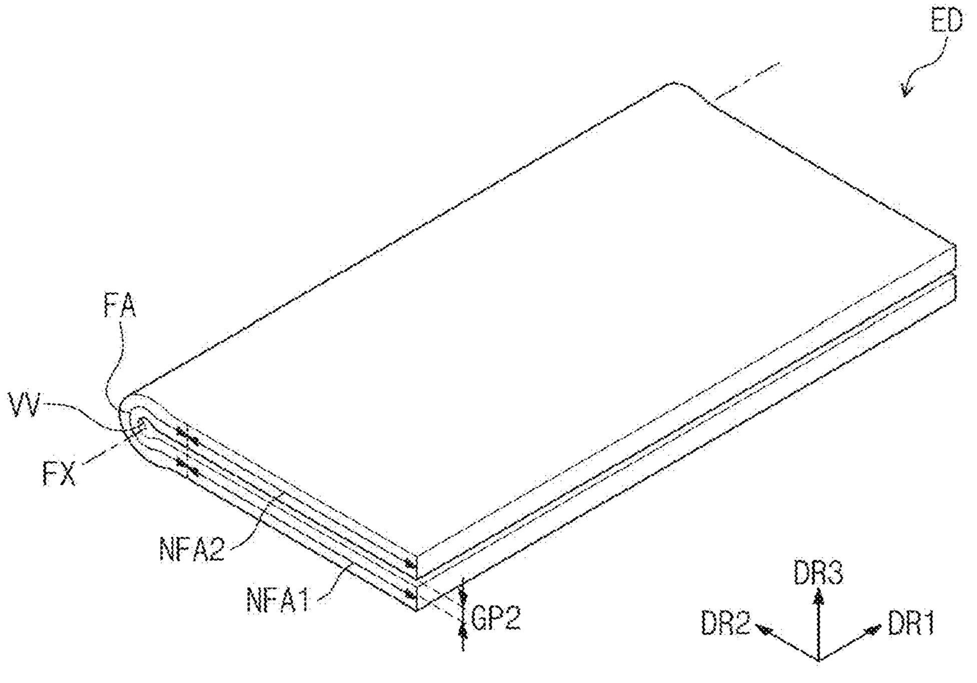

FIGS. 1A to 1C are perspective views showing an electronic device ED according to some embodiments of the present disclosure. FIG. 1A shows an unfolded state of the electronic device ED, and FIGS. 1B and 1C show a folded state of the electronic device ED.

Referring to FIGS. 1A to 1C, the electronic device ED may include a display surface DS defined by a first direction DR1 and a second direction DR2 intersecting the first direction DR1. The electronic device ED may display an image IM to a user through the display surface DS.

The display surface DS may include a display area DA and a non-display area NDA around (e.g., in a periphery or outside a footprint of) the display area DA. The display area DA may display the image IM, and the non-display area NDA may not display the image IM. The non-display area NDA may surround (e.g., in a periphery or outside a footprint of) at least a portion of the display area DA. However, it should not be limited thereto or thereby, and the shape of the display area DA and the shape of the non-display area NDA may be changed.

The display surface DS of the electronic device ED may include a sensing area TA. The sensing area TA may be defined in the display area DA. The sensing area TA may have a transmittance higher than that of the other area of the display area DA.

An optical signal, e.g., a visible light or an infrared light, may pass through the sensing area TA. The electronic device ED may capture an external object using the visible light passing through the sensing area TA or may determine whether an external object is approaching using the infrared light. FIG. 1A shows one sensing area TA as a representative example, however, the number of the sensing areas TA should not be limited thereto or thereby. According to some embodiments, the sensing area TA may be provided in plural.

Hereinafter, a direction perpendicular (or substantially perpendicular) to a plane defined by the first direction DR1 and the second direction DR2 may be referred to as a third direction DR3. Front and lower surfaces of each member of the electronic device ED may distinguished from each other with respect to the third direction DR3. In the present disclosure, the expressions "when viewed in a plane" or "in a plan view" may mean a state of being viewed in the third direction DR3.

The electronic device ED may include a folding area FA and a plurality of non-folding areas NFA1 and NFA2. The non-folding areas NFA1 and NFA2 may include a first non-folding area NFA1 and a second non-folding area NFA2. The first non-folding area NFA1 and the second non-folding area NFA2 may be spaced apart from each other with the folding area FA interposed therebetween in the second direction DR2.

As shown in FIG. 1B, the folding area FA may be configured to be folded with respect to a folding axis FX parallel (or substantially parallel) to the first direction DR1 without damaging the electronic device ED. When the electronic device ED is folded with respect to the folding axis FX, the folding area FA may have a curvature (e.g., a set or predetermined curvature) and a radius of curvature VV. A first gap GP1 between the first non-folding area NFA1 and the second non-folding area NFA2 may be similar to or the same as twice of the radius of curvature VV. The electronic device ED may be inwardly folded (inner-folding) such that the first non-folding area NFA1 faces the second non-folding area NFA2 and the display surface DS is not exposed to the outside.

As shown in FIG. 1C, when the electronic device ED is folded with respect to the folding axis FX, a second gap GP2 between the first non-folding area NFA1 and the second non-folding area NFA2 may be smaller than twice of the radius of curvature VV. Accordingly, the second gap GP2 between the first non-folding area NFA1 and the second non-folding area NFA2 in the folded state may be relatively reduced. Thus, the electronic device ED may have a slim profile when folded.

However, embodiments according to the present disclosure should not be limited thereto or thereby. The electronic device ED may be outwardly folded (outer-folding) such that the display surface DS is exposed to the outside. According to some embodiments, the electronic device ED may be provided such that the inner-folding operation or the outer-folding operation is repeated from an unfolding operation. According to some embodiments, the electronic device ED may be provided to carry out any one of the unfolding operation, the inner-folding operation, and/or the outer-folding operation.

Figure 2A:
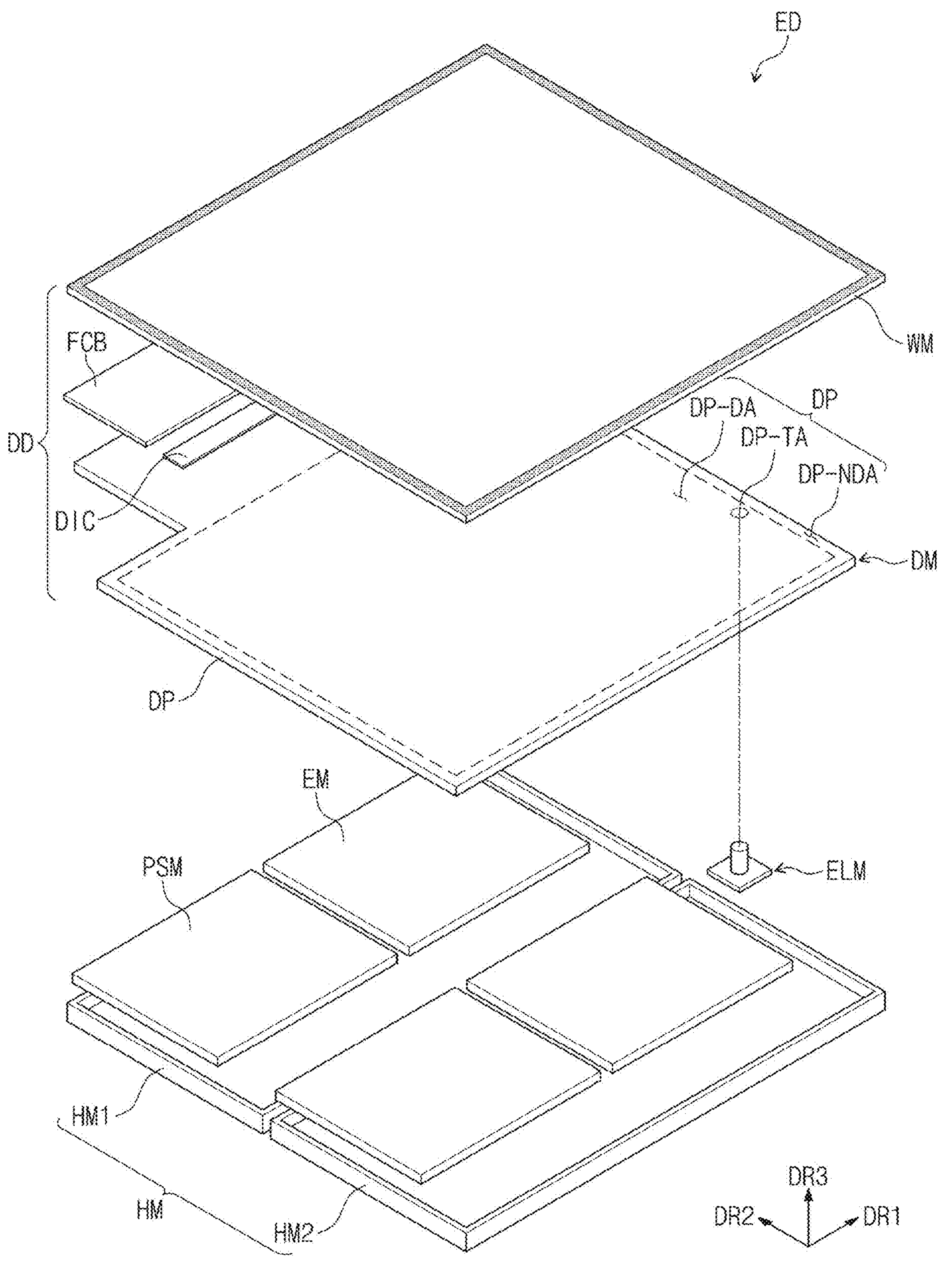
FIG. 2A is an exploded perspective view of an electronic device according to some embodiments of the present disclosure.
Figure 2B:
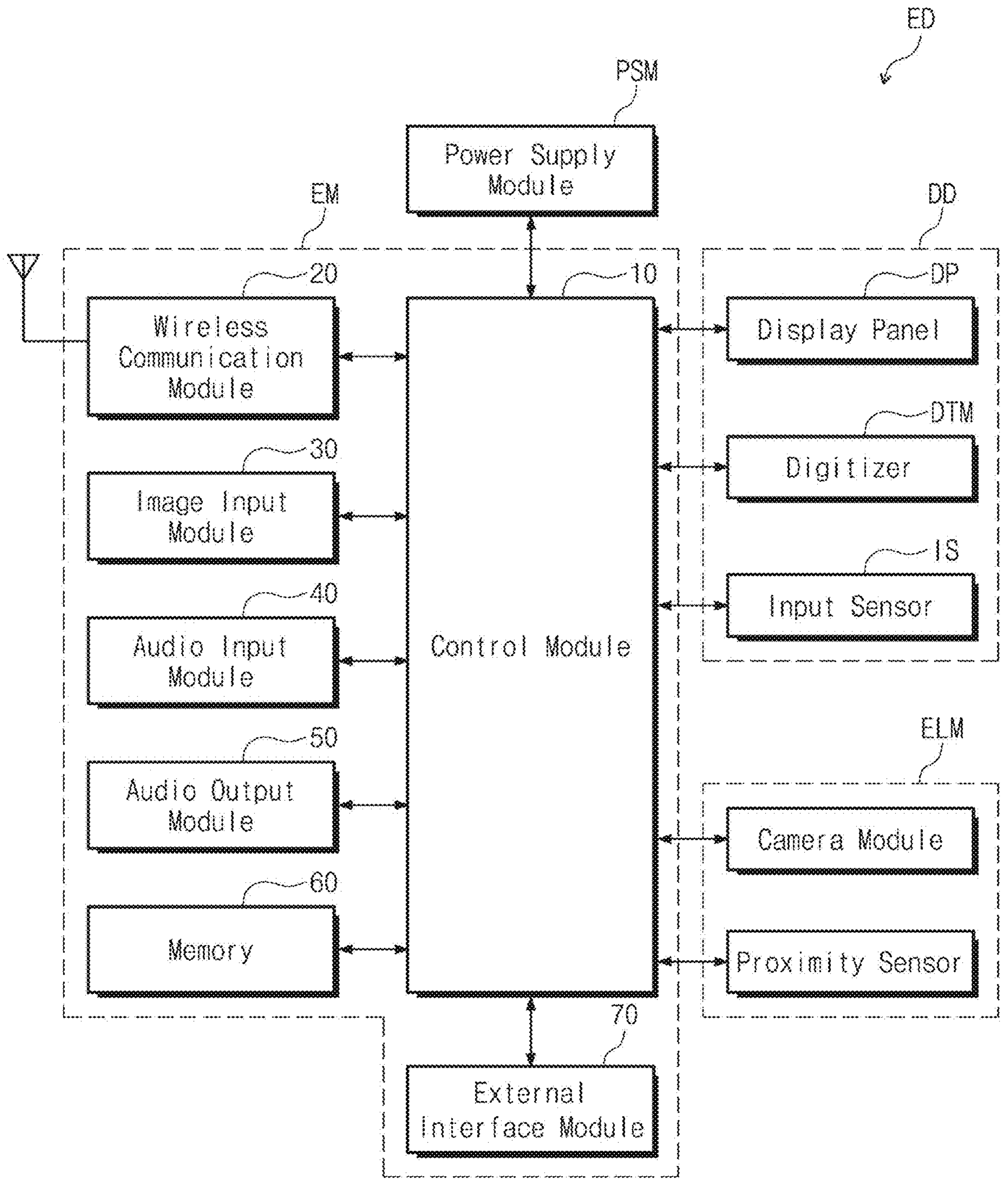
FIG. 2B is a block diagram of an electronic device according to some embodiments of the present disclosure.

FIG. 2A is an exploded perspective view showing the electronic device ED according to some embodiments of the present disclosure. FIG. 2B is a block diagram showing the electronic device ED according to some embodiments of the present disclosure.

Referring to FIGS. 2A and 2B, the electronic device ED may include a display device DD, an electronic module EM, an electro-optical module ELM, a power supply module PSM, and a housing HM. According to some embodiments, the electronic device ED may further include a mechanical structure, e.g., a hinge, that is coupled to the housing HM and controls a folding operation of the display device DD.

The display device DD may generate an image and may sense an external input. The display device DD may include a window WM and a display module DM. The window WM may provide the display surface DS of the electronic device ED. The window WM will be described in more detail later.

The display module DM may include a display panel DP. FIG. 2A shows only the display panel DP among components of the display module DM, which are stacked one on another, however, the display module DM may further include a plurality of components located on or above the display panel DP. Detailed descriptions on a stack structure of the display module DM will be described in more detail later.

Types of the display panel DP should not be particularly limited, and the display panel DP may be a light emitting type display panel, for example, an organic light emitting display panel or a quantum dot light emitting display panel.

The display panel DP may include a display area DP-DA and a non-display area DP-NDA, which respectively correspond to the display area DA (refer to FIG. 1A) and the non-display area NDA (refer to FIG. 1A) of the electronic device ED. In the present disclosure, the expression "An area/portion corresponds to another area/portion." means that "An area/portion overlaps another area/portion.", however, the "areas and portions" should not be limited to having the same size as each other.

Referring to FIG. 2A, a driving chip DIC may be located in the non-display area DP-NDA of the display panel DP. A flexible circuit board FCB may be coupled with the non-display area DP-NDA of the display panel DP. The flexible circuit board FCB may be connected to a main circuit board. The main circuit board may be an electronic component constituting the electronic module EM.

The driving chip DIC may include driving elements, e.g., a data driving circuit, to drive pixels of the display panel DP. FIG. 2A shows a structure in which the driving chip DIC is mounted on the display panel DP, however, embodiments according to the present disclosure should not be limited thereto or thereby. As an example, the driving chip DIC may be mounted on the flexible circuit board FCB.

A portion of the non-display area DP-NDA of the display module DM may be bent. As an example, in the non-display area DP-NDA, the portion where the driving chip DIC and the flexible circuit board FCB are arranged and the width in the first direction DR1 is narrowed may be bent with respect to a bending axis extending along the first direction DR1. In this case, the non-display area DP-NDA of the display module DM may be accommodated in the housing HM while being bent. This will be described in more detail later with reference to FIG. 3A.

As shown in FIG. 2B, the display device DD may further include an input sensor IS and a digitizer DTM in addition to the display panel DP. The input sensor IS may sense a user input. The input sensor IS that senses an external input in a capacitive method may be located above the display panel DP. The digitizer DTM may sense an input generated by a stylus pen. The digitizer DTM may sense the external input in an electromagnetic-resonance method. The digitizer DTM may be located under the display panel DP.

The electronic module EM may include a control module 10, a wireless communication module 20, an image input module 30, an audio input module 40, an audio output module 50, a memory 60, and an external interface module 70. The electronic module EM may include the main circuit board, and the modules may be mounted on the main circuit board or may be electrically connected to the main circuit board via a flexible circuit board. Each of the input sensor IS and the digitizer DTM may be connected to the main circuit board via a connector. The electronic module EM may be electrically connected to the power supply module PSM.

The electronic module EM may be located in each of a first housing HM1 and a second housing HM2, and the power supply module PSM may be located in each of the first housing HM1 and the second housing HM2. According to some embodiments, the electronic module EM located in the first housing HM1 and the electronic module EM located in the second housing HM2 may be electrically connected to each other via the flexible circuit board.

The control module 10 may control an overall operation of the electronic device ED. For example, the control module 10 may activate or deactivate the display device DD in response to the user input. The control module 10 may control the image input module 30, the audio input module 40, and the audio output module 50 to meet the user input. The control module 10 may include at least one microprocessor.

The wireless communication module 20 may transmit/receive a wireless signal to/from other terminals using a Bluetooth or WiFi link. The wireless communication module 20 may transmit/receive a voice signal using a general communication line. The wireless communication module 20 may include a plurality of antenna modules.

The image input module 30 may process an image signal and may convert the image signal into image data that may be displayed through the display device DD. The audio input module 40 may receive an external audio signal through a microphone in a record mode or a voice recognition mode and may convert the external audio signal to electrical voice data. The audio output module 50 may convert audio data provided from the wireless communication module 20 or the audio data stored in the memory 60 and may output the converted audio data to the outside.

The external interface module 70 may serve as an interface between the control module 10 and external devices, such as an external charger, a wired/wireless data port, a card socket (e.g., a memory card and a SIM/UIM card), etc.

The power supply module PSM may supply a power source necessary for the overall operation of the electronic device ED. The power supply module PSM may include a normal battery device.

The electro-optical module ELM may be an electronic component that outputs or receives an optical signal. The electro-optical module ELM may include a camera module and/or a proximity sensor. The camera module may be configured to take a picture of an external object via a sensing area DP-TA. The electro-optical module ELM may be located under the display device DD and may overlap the sensing area DP-TA.

The housing HM may be coupled to the window WM to accommodate the above-mentioned modules. The housing HM may include the first and second housings HM1 and HM2 separated from each other, however, it should not be limited thereto or thereby. According to some embodiments, the electronic device ED may further include a hinge structure to connect the first and second housings HM1 and HM2 to each other.

Figure 3A:
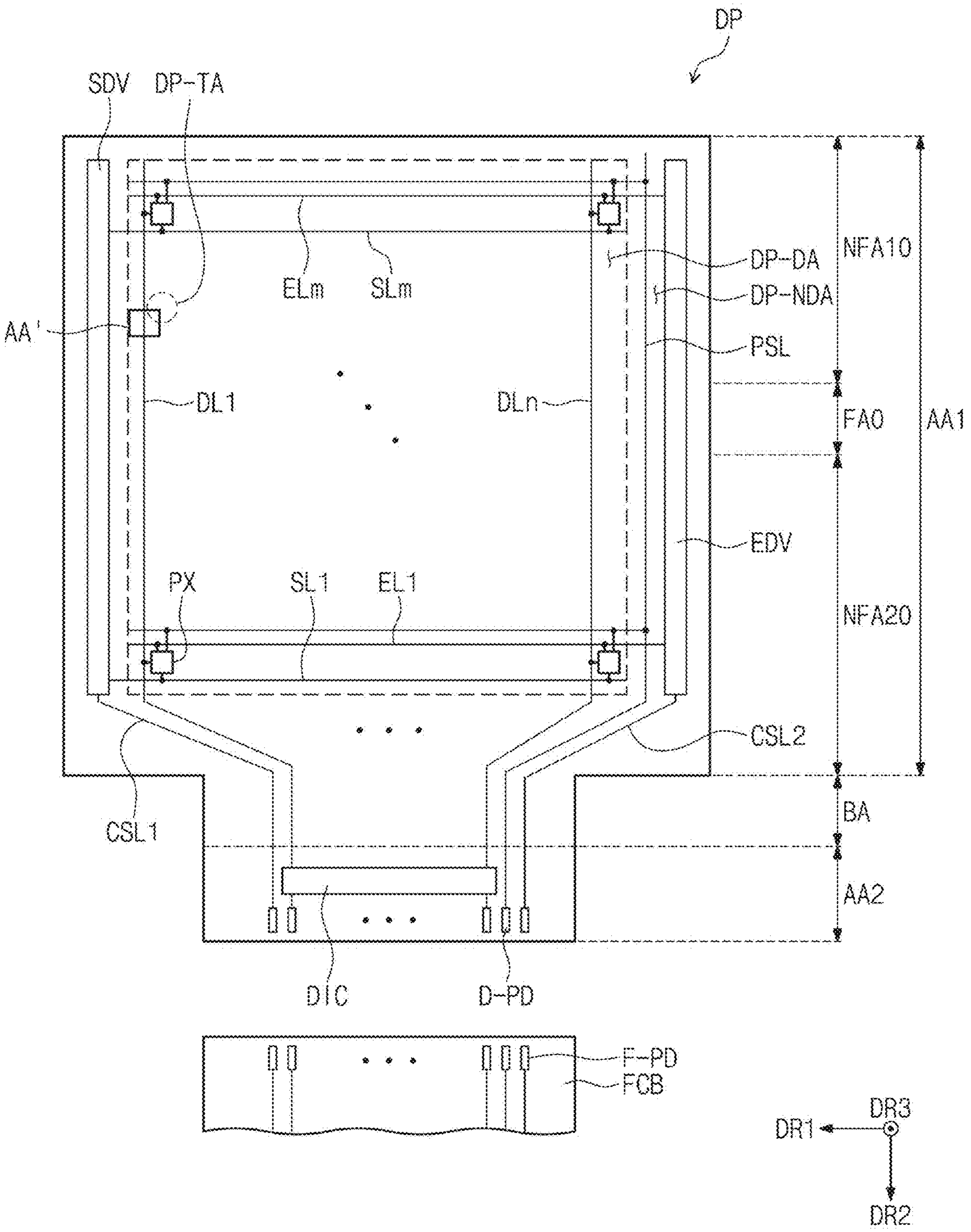
FIG. 3A is a plan view of a display panel according to some embodiments of the present disclosure.
Figure 3B:
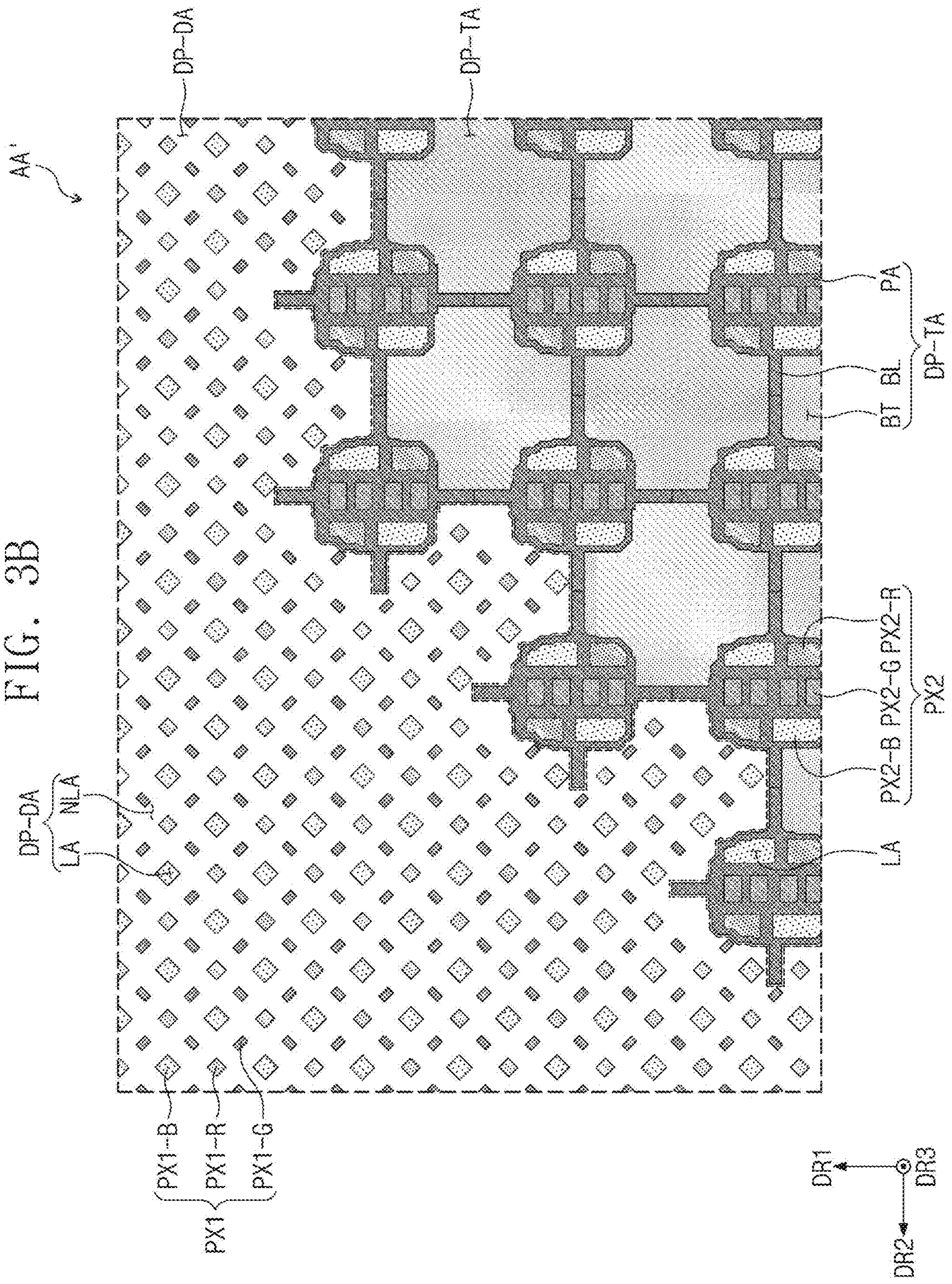
FIG. 3B is an enlarged plan view of an area AA' of FIG. 3A.
Figure 4:
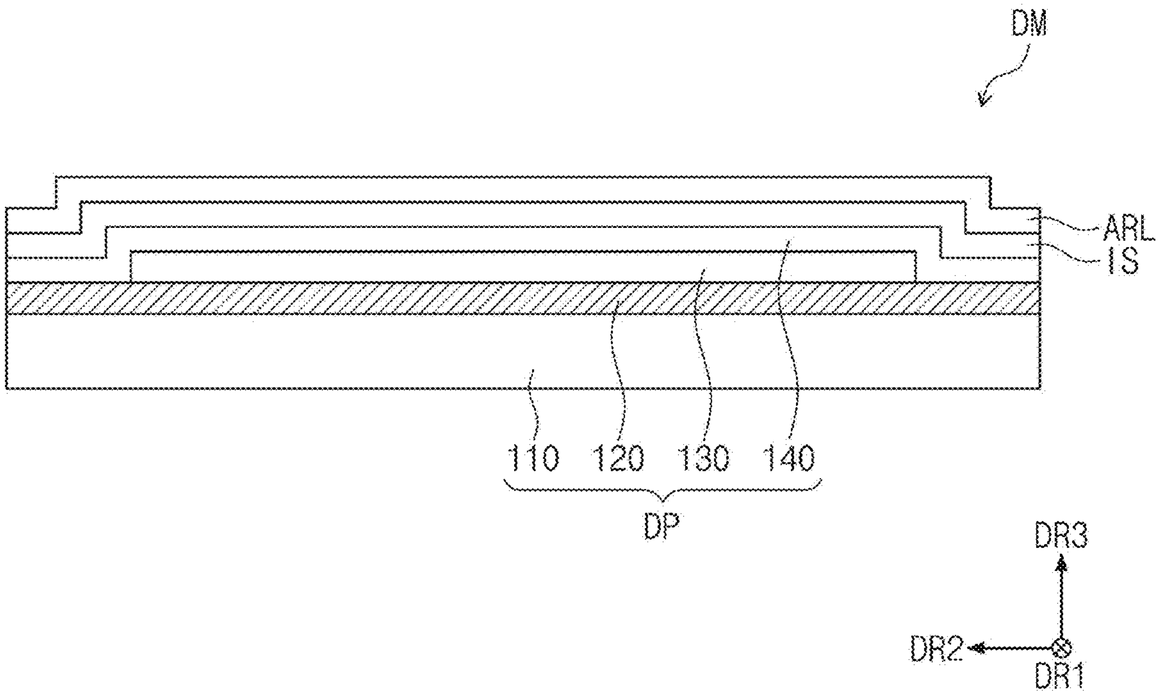
FIG. 4 is a cross-sectional view of a display module according to some embodiments of the present disclosure.

FIG. 3A is a plan view of the display panel DP according to some embodiments of the present disclosure. FIG. 3B is an enlarged plan view of an area AA' of the display panel of FIG. 3A. FIG. 4 is a cross-sectional view of the display module DM according to some embodiments of the present disclosure.

Referring to FIG. 3A, the display panel DP may include the display area DP-DA and the non-display area DP-NDA around the display area DP-DA. The display area DP-DA and the non-display area DP-NDA may be distinguished from each other by the presence or absence of a pixel PX. The pixel PX may be located in the display area DP-DA. A scan driver SDV, a data driver, and an emission driver EDV may be located in the non-display area DP-NDA. The data driver may be a circuit provided in the driving chip DIC shown in FIG. 3A.

The display panel DP may include a first non-bending area AA1, a second non-bending area AA2, and a bending area BA, which are distinct from each other in the second direction DR2. The second non-bending area AA2 and the bending area BA may be areas of the non-display area DP-NDA. The bending area BA may be defined between the first non-bending area AA1 and the second non-bending area AA2.

The first non-bending area AA1 may correspond to the display surface DS of FIG. 1A. The first non-bending area AA1 may include the first non-folding area NFA10, the second non-folding area NFA20, and the folding area FA0. The first non-folding area NFA10, the second non-folding area NFA20, and the folding area FA0 may respectively correspond to the first non-folding area NFA10, the second non-folding area NFA20, and the folding area FA of FIGS. 1A to 1C.

A length in the first direction DR1 of the bending area BA and the second non-bending area AA2 may be smaller than a length in the first direction DR1 of the first non-bending area AA1. The bending area BA having a relatively short length in the first direction DR1 may be relatively easily bent with respect to the bending axis extending in the first direction DR1.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a power supply line PSL, and a plurality of display pads D-PD. In the present embodiments, each of "m" and "n" is a natural number. The pixels PX may be connected to the scan lines SL1 to SLm, the data lines DL1 to DLn, and the emission lines EL1 to ELm. Although FIG. 3A, for example, illustrates four pixels PX, as a person having ordinary skill in the art would recognize, the pixels PX may be arranged in a plurality of rows and columns on the display panel DP, and the number of pixels PX (or rows/columns of pixels PX) may vary according to the design and size of the display panel DP.

The scan lines SL1 to SLm may extend in the first direction DR1 and may be connected to the scan driver SDV. The data lines DL1 to DLn may extend in the second direction DR2 and may be connected to the driving chip DIC via the bending area BA. The emission lines EL1 to ELm may extend in a direction parallel to the first direction DR1 and may be connected to the emission driver EDV.

The power supply line PSL may include a portion extending in the first direction DR1 and a portion extending in the second direction DR2. The portion extending in the second direction DR2 and the portion extending in the first direction DR1 may be located on different layers from each other. The portion of the power supply line PSL, which extends in the second direction DR2, may extend to the second non-bending area AA2 via the bending area BA. The power supply line PSL may provide a first voltage to the pixels PX.

The first control line CSL1 may be connected to the scan driver SDV and may extend to a lower end of the second non-bending area AA2 via the bending area BA. The second control line CSL2 may be connected to the emission driver EDV and may extend to the lower end of the second non-bending area AA2 via the bending area BA.

When viewed in a plane (e.g., in a plan view), the display pads D-PD may be located adjacent to the lower end of the second non-bending area AA2. The driving chip DIC, the power supply line PSL, the first control line CSL1, and the second control line CSL2 may be connected to the display pads D-PD. The flexible circuit film FCB may include substrate pads F-PD electrically connected to corresponding display pads D-PD through an anisotropic conductive adhesive layer.

Referring to FIG. 3B, the sensing area DP-TA of the electronic device ED (refer to FIG. 1A) may have a light transmittance higher than that of the display area DP-DA in a unit area (or an area of the same size). A ratio of an area occupied by a light blocking structure to an entire area may be smaller in the sensing area DP-TA than in the display area DP-DA based on the unit area. The light blocking structure may include a conductive pattern of a circuit layer, an electrode of a light emitting element, and a light blocking pattern, etc., which are described later.

The sensing area DP-TA may have a resolution lower than that of the display area DP-DA in the unit area. The number of the pixels arranged in the sensing area DP-TA may be smaller than that of the display area DP-DA in the unit area (or in an area of the same size).

As shown in FIG. 3B, a first pixel PX1 may be located in the display area DP-DA, and a second pixel PX2 may be located in the sensing area DP-TA. When comparing color pixels of the first pixel PX1 with color pixels of the second pixel PX2, the color pixels having the same color in the first pixel PX1 and the second pixel PX2 may have different light emitting areas from each other. The first pixel PX1 and the second pixel PX2 may have different arrangements from each other.

FIG. 3B shows light emitting areas LA of the first pixel PX1 and the second pixel PX2 as a representative of the first pixel PX1 and the second pixel PX2. Each of the light emitting areas LA may be defined as an area where an anode of the light emitting element is exposed without being covered by a pixel definition layer. In the display area DP-DA, a non-light-emitting area NLA may be defined between the light emitting areas LA.

The first pixel PX1 may include a first color pixel PX1-R, a second color pixel PX1-G, and a third color pixel PX1-B, and the second pixel PX2 may include a first color pixel PX2-R, a second color pixel PX2-G, and a third color pixel PX2-B. The first color pixel PX1-R and the first color pixel PX2-R may emit a red light, the second color pixel PX1-G and the second color pixel PX2-G may emit a green light, and the third color pixel PX1-B and the third color pixel PX2-B may emit a blue light.

The sensing area DP-TA may include a pixel area PA, a line area BL, and a transmission area BT. The second pixel PX2 may be located in the pixel area PA. FIG. 3B shows a structure in which two first color pixels PX2-R, four second color pixels PX2-G, and two third color pixels PX2-B are located in one pixel area PA, however, embodiments according to the present disclosure should not be limited thereto or thereby.

In the pixel area PA and the line area BL, a conductive pattern, a signal line, or a light blocking pattern, which are related to the second pixel PX2, may be located. The light blocking pattern may be a metal pattern and may overlap (or substantially overlap) the pixel area PA and the line area BL. The pixel area PA and the line area BL may be a non-transmission area.

The transmission area BT may be an area through which an optical signal or an external light passes. Because the second pixel PX2 is not located in the transmission area BT, the conductive pattern, the signal line, or the light blocking pattern may not be located. Accordingly, the transmission area BT may increase the light transmittance of the sensing area DP-TA. According to some embodiments, the electro-optical module ELM described with reference to FIG. 2A overlaps the sensing area DP-TA, and thus, an efficiency in optical signal reception may be relatively improved.

However, embodiments according to the present disclosure should not be limited thereto or thereby, and the sensing area DP-TA may be defined as a hole that penetrates the display module DM from a front surface to a rear surface of the display module DM. In this case, the hole may overlap the electro-optical module ELM (refer to FIG. 2B).

FIG. 4 is a cross-sectional view of the display module DM according to some embodiments of the present disclosure.

Referring to FIG. 4, the display module DM may include the display panel DP, the input sensor IS, and an anti-reflective layer ARL. The display panel DP may include a base layer 110, a circuit layer 120, a light emitting element layer 130, and an encapsulation layer 140.

The base layer 110 may provide a base surface on which the circuit layer 120 is located. The base layer 110 may be a flexible substrate that is bendable, foldable, or rollable.

The base layer 110 may be a glass substrate, a metal substrate, or a polymer substrate, however, it should not be limited thereto or thereby. According to some embodiments, the base layer 110 may be an inorganic layer, an organic layer, or a composite material layer.

The base layer 110 may have a multi-layer structure. For instance, the base layer 110 may include a first synthetic resin layer, an inorganic layer having a single-layer or multi-layer structure, and a second synthetic resin layer located on the inorganic layer having a single-layer or multi-layer structure. Each of the first and second synthetic resin layers may include a polyimide-based resin, however, it should not be particularly limited.

The circuit layer 120 may be located on the base layer 110. The circuit layer 120 may include an insulating layer, a semiconductor pattern, a conductive pattern, and a signal line.

The light emitting element layer 130 may be located on the circuit layer 120. The light emitting element layer 130 may include the light emitting element. For example, the light emitting element may include an organic light emitting material, an inorganic light emitting material, an organic-inorganic light emitting material, a quantum dot, a quantum rod, a micro-LED, or a nano-LED.

The encapsulation layer 140 may be located on the light emitting element layer 130. The encapsulation layer 140 may protect the light emitting element layer 130 from moisture, oxygen, and a foreign substance such as dust particles. The encapsulation layer 140 may include at least one inorganic layer. The encapsulation layer 140 may include a stack structure in which an inorganic layer, an organic layer, and an inorganic layer are sequentially stacked.

The input sensor IS may be located directly on the display panel DP. The input sensor IS may be formed with the display panel DP through successive processes. In the present disclosure, the expression "The input sensor IS is located directly on the display panel DP." means that no intervening elements are present between the input sensor IS and the display panel DP. That is, a separate adhesive member may not be located between the input sensor IS and the display panel DP.

The anti-reflective layer ARL may be located directly on the input sensor IS. The anti-reflective layer ARL may relatively reduce a reflectance of an external light incident to the display device DD (refer to FIG. 2A) from the outside. The anti-reflective layer ARL may include color filters. The color filters may be arranged in an arrangement (e.g., a set or predetermined arrangement). As an example, the color filters may be arranged by taking into account colors of lights emitted from the pixels included in the display panel DP. In addition, the anti-reflective layer ARL may further include a black matrix adjacent to the color filters.

According to some embodiments, positions of the input sensor IS and the anti-reflective layer ARL may be changed with each other. According to some embodiments, the anti-reflective layer ARL may be replaced with a polarizing film. The polarizing film may be coupled with the input sensor IS using an adhesive layer.

Figure 5A:
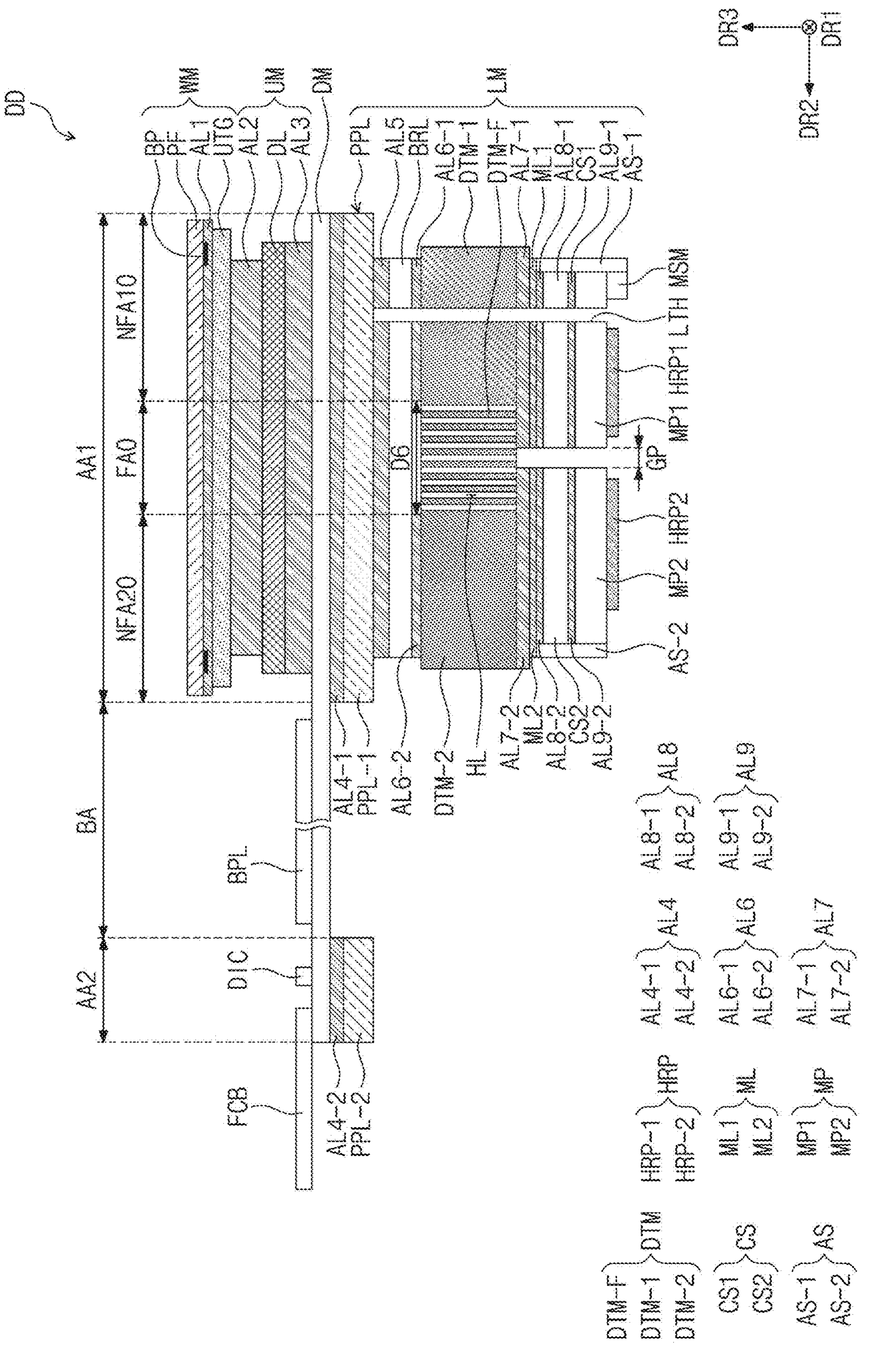
FIG. 5A is a cross-sectional view of a display device according to some embodiments of the present disclosure.
Figure 5B:
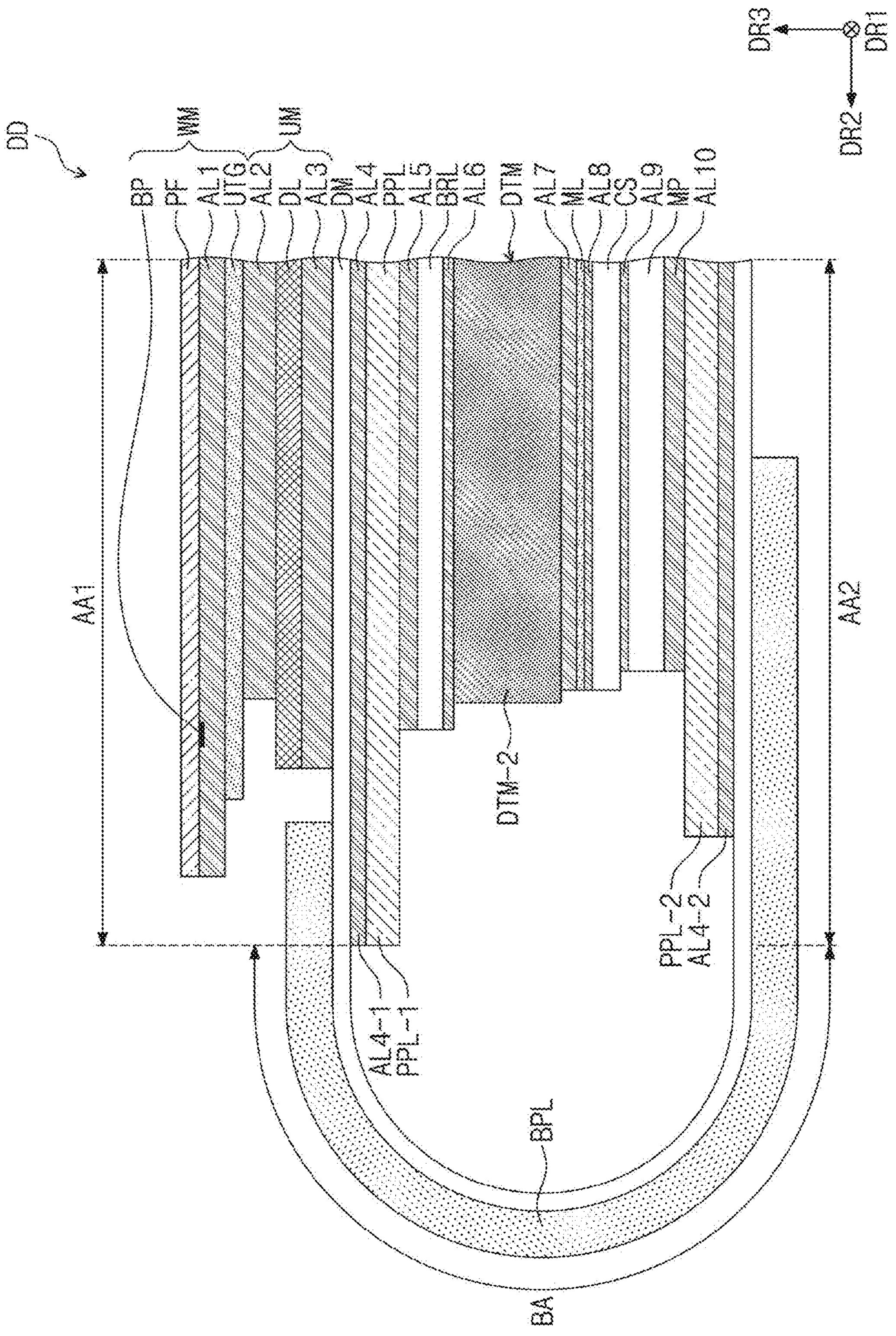
FIG. 5B is a cross-sectional view of a display device that is bent according to some embodiments of the present disclosure.

FIG. 5A is a cross-sectional view of the display device DD according to some embodiments of the present disclosure, and FIG. 5B is a cross-sectional view of the display device DD that is bent according to some embodiments of the present disclosure.

Referring to FIGS. 5A and 5B, the display device DD may include the window WM, an upper member UM, the display module DM, and a lower member LM. The upper member UM may collectively refer to components located between the window WM and the display module DM, and the lower member LM may collectively refer to components located under the display module DM.

The window WM may include a thin glass substrate UTG, a window protective layer PF located on the thin glass substrate UTG, and a bezel pattern BP located on a lower surface of the window protective layer PF. According to some embodiments, the window protective layer PF may include a synthetic resin film.

The bezel pattern BP may be located on one surface of the thin glass substrate UTG or one surface of the window protective layer PF. FIG. 5A shows the structure in which the bezel pattern BP is located on the lower surface of the window protective layer PF, however, it should not be limited thereto or thereby. According to some embodiments, the bezel pattern BP may be located on an upper surface of the window protective layer PF. The bezel pattern BP may be a colored light blocking layer and may be formed by a coating process. The bezel pattern BP may include a base material and a pigment or a dye mixed with the base material. The non-display area NDA shown in FIG. 1A may be defined by a shape of the bezel pattern BP.

The thin glass substrate UTG may have a thickness in a range from 15 μm to 45 μm (or about 15 μm to about 45 μm). The thin glass substrate UTG may be a chemically strengthened glass. The occurrence of crease in the thin glass substrate UTG may be minimized or reduced even though the folding and unfolding operations are repeatedly performed.

The window protective layer PF may have a thickness in a range from 50 μm to 80 μm (or about 50 μm to about 80 μm). The synthetic resin film of the window protective layer PF may include polyimide, polycarbonate, polyamide, triacetylcellulose, polymethylmethacrylate, or polyethylene terephthalate. According to some embodiments, at least one of a hard coating layer, an anti-fingerprint layer, or an anti-reflective layer may be located on the upper surface of the window protective layer PF.

The window protective layer PF may be coupled with the thin glass substrate UTG by a first adhesive layer AL1. The first adhesive layer AL1 may be a pressure sensitive adhesive (PSA) film or an optically clear adhesive (OCA). Adhesive layers described hereinafter may include the same adhesive as the first adhesive layer AL1.

The first adhesive layer AL1 may be separated from the thin glass substrate UTG. An adhesive force between the first adhesive layer AL1 and the thin glass substrate UTG may be smaller than an adhesive force between the first adhesive layer AL1 and the window protective layer PF. Because the window protective layer PF is located above the thin glass substrate UTG, scratches may occur relatively easily on the window protective layer PF. After the first adhesive layer AL1 and the window protective layer PF are separated from each other, another window protective layer PF may be attached to the thin glass substrate UTG.

When viewed in a plane (e.g., in a plan view), an edge of the thin glass substrate UTG may not overlap the bezel pattern BP. When the above conditions are satisfied, the edge of the thin glass substrate UTG may be exposed without being covered by the bezel pattern BP, and fine cracks generated on the edge of the thin glass substrate UTG may be inspected using an inspection device.

The upper member UM may include an upper film DL. The upper film DL may include a synthetic resin film. The synthetic resin film may include polyimide, polycarbonate, polyamide, triacetylcellulose, polymethylmethacrylate, or polyethylene terephthalate.

The upper film DL may absorb an external impact applied to the front surface of the display device DD. The display module DM described with reference to FIG. 4 may include the anti-reflective layer ARL employed instead of the polarizing film, and thus an impact resistance to external impacts applied to the front side of the display device DD may be relatively reduced. The upper film DL may compensate for the impact resistance to the external impacts, which is reduced by applying the anti-reflective layer ARL to the display device DD. According to some embodiments, the upper film DL may be omitted. The thin glass substrate UTG may be attached to the upper member UM by a second adhesive layer AL2. The upper film DL may be attached to the display module DM by a third adhesive layer AL3.

The lower member LM may include a panel protective layer PPL, a barrier layer BRL, the digitizer DTM, a metal layer ML, a cushion layer CS, a metal plate MP, a heat dissipation layer HRP, a magnetic field shielding sheet MSM, and a step difference compensation member AS. The components of the lower member LM except the digitizer DTM may be defined as functional layers.

The panel protective layer PPL may be located under the display module DM. The panel protective layer PPL may protect a lower portion of the display module DM. The panel protective layer PPL may include a flexible synthetic resin film. For example, the panel protective layer PPL may include polyethylene terephthalate.

According to some embodiments, the panel protective layer PPL may not be located in the bending area BA. The panel protective layer PPL may include a first panel protective layer PPL-1 to protect the first non-bending area AA1 of the display panel DP (refer to FIG. 3A) and a second panel protective layer PPL-2 to protect the second non-bending area AA2 of the display panel DP (refer to FIG. 3A).

A fourth adhesive layer AL4 may attach the panel protective layer PPL to the display module DM. The fourth adhesive layer AL4 may include a first portion AL4-1 corresponding to the first panel protective layer PPL-1 and a second portion AL4-2 corresponding to the second panel protective layer PPL-2.

As shown in FIG. 5B, when the bending area BA is bent, the second panel protective layer PPL-2 may be located under the first non-bending area AA1 and the first panel protective layer PPL-1 with the second non-bending area AA2. Because the panel protective layer PPL is not located in the bending area BA, the bending area BA may be more easily bent. The second panel protective layer PPL-2 may be attached to the metal plate MP by a tenth adhesive layer AL10. The tenth adhesive layer AL10 may be omitted. According to some embodiments, an additional element such as an insulating tape may be further located between the second panel protective layer PPL-2 and the metal plate MP.

As shown in FIG. 5B, the bending area BA may have a curvature (e.g., a set or predetermined curvature) and a radius of curvature (e.g., a set or predetermined radius of curvature). The radius of curvature may be within a range from 0.1 millimeters (mm) to 0.5 mm (or about 0.1 mm to about 0.5 mm). A bending protective layer BPL may be located at least in the bending area BA. The bending protective layer BPL may overlap the bending area BA, the first non-bending area AA1, and the second non-bending area AA2. The bending protective layer BPL may be located on an entire portion of the bending area BA, a portion of the first non-bending area AA1, and a portion of the second non-bending area AA2.

The bending protective layer BPL located in in the bending area BA may be bent. The bending protective layer BPL may protect the bending area BA from the external impact and may control a neutral surface of the bending area BA. The bending protective layer BPL may control stress of the bending area BA such that the neutral surface is close to the signal lines arranged in the bending area BA.

Referring to FIG. 5A again, the barrier layer BRL may be located under the panel protective layer PPL. The barrier layer BRL and the panel protective layer PPL may be coupled with each other by a fifth adhesive layer AL5.

The barrier layer BRL may increase a resistance against a compressive force caused by external pressure force. Accordingly, the barrier layer BRL may prevent the display panel DP from being deformed. The barrier layer BRL may include a flexible plastic material, such as polyimide or polyethylene terephthalate. In addition, the barrier layer BRL may be a colored film with low light transmittance. The barrier layer BRL may absorb a light incident thereto from the outside.

As an example, the barrier layer BRL may be a black synthetic resin film. When looking at the display device DD from an upper side of the window protective layer PF, components located under the barrier layer BRL may not be viewed by the user.

The barrier layer BRL may be attached to the digitizer DTM by a sixth adhesive layer AL6. The sixth adhesive layer AL6 may include a first portion AL6-1 and a second portion AL6-2 separated from the first portion AL6-1. A distance D6 (or an interval) between the first portion AL6-1 and the second portion AL6-2 may correspond to a width of the folding area FA0 and may be greater than a gap GP described later. The distance D6 between the first portion AL6-1 and the second portion AL6-2 may be within a range from 5 mm to 15 mm (or about 5 mm to about 15 mm).

According to some embodiments, the first portion AL6-1 and the second portion AL6-2 may be defined as different portions of one adhesive layer, however, they should not be limited thereto or thereby. When the first portion AL6-1 is defined as one adhesive layer, e.g., a first adhesive layer or a second adhesive layer, the second portion AL6-2 may be defined as another adhesive layer, e.g., a second adhesive layer or a third adhesive layer. The above-described definitions may be applied not only to the sixth adhesive layer AL6 but also to adhesive layers including two portions among adhesive layers described later.

The digitizer DTM may sense an input generated by an electromagnetic pen. In this case, the digitizer DTM may sense the input applied thereto by the electromagnetic pen in an electromagnetic resonance (EMR) method.

The digitizer DTM may include a first non-folding portion DTM-1 overlapping the first non-folding area NFA10, a folding portion DTM-F overlapping the folding area FA0, and a second non-folding portion DTM-2 overlapping the second non-folding area NFA20.

The folding portion DTM-F may be provided with holes HL defined therethrough from an upper surface to a lower surface of the folding portion DTM-F to facilitate the folding operation of the electronic device ED.

Because there is a difference in arrangement between sensing coils located at outermost portions of the folding portion DTM-F and sensing coils located between the outermost portions of the folding portion DTM-F in the digitizer DTM, a sensing performance may vary depending on positions in the folding portion DTM-F. Accordingly, in the digitizer DTM including the folding portion DTM-F through which the holes HL are defined, the sensing performance of the outermost portions of the folding portion DTM-F is required to be compensated.

The metal layer ML may be located under the digitizer DTM. The metal layer ML may include a first metal layer ML1 overlapping the first non-folding portion DTM-1 and a second metal layer ML2 overlapping the second non-folding portion DTM-2. Each of the first metal layer ML1 and the second metal layer ML2 may overlap a portion of the folding portion DTM-F, and the first metal layer ML1 and the second metal layer ML2 may be spaced apart from each other in the folding portion DTM-F.

The metal layer ML may dissipate heat generated when the digitizer DTM is driven to the outside. The metal layer ML may transfer the heat generated by the digitizer DTM downward. The metal layer ML may have an electrical conductivity and a thermal conductivity, which are higher than those of the metal plate MP described later. The metal layer ML may include a conductive material such as copper or aluminum. The metal layer ML having the relatively high electrical conductivity may prevent or reduce an electromagnetic wave generated by the electronic module EM (refer to FIG. 2A) located thereunder from exerting influence on the digitizer DTM as noise.

The digitizer DTM may be attached to the metal layer ML by a seventh adhesive layer AL7. The seventh adhesive layer AL7 may include a first portion AL7-1 corresponding to the first metal layer ML1 and a second portion AL7-2 corresponding to the second metal layer ML2.

The cushion layer CS may be located under the metal layer ML. The cushion layer CS may protect the display module DM from impacts applied from a lower side of the display module DM. The cushion layer CS may include a first cushion layer CS1 overlapping the first non-folding portion DTM-1 and a second cushion layer CS2 overlapping the second non-folding portion DTM-2. The first and second cushion layers CS1 and CS2 may overlap a portion of the folding portion DTM-F and may be spaced apart from each other in the folding portion DTM-F.

When the display device DD is folded, the first cushion layer CS1 and the second cushion layer CS2 may prevent or reduce instances of a foreign substance entering the holes HL. When the display device DD is unfolded, the first cushion layer CS1 and the second cushion layer CS2 may be spaced apart from each other in an area overlapping the folding portion DTM-F even though the folding portion DTM-F is folded with a curvature (e.g., a set or predetermined curvature), and thus, the shape of the digitizer DTM may be relatively easily changed.

The cushion layer CS may include a foam or a sponge. The foam may include a polyurethane foam or a thermoplastic polyurethane foam. When the cushion layer CS includes the foam, the cushion layer CS may include a barrier film as its base layer, and the cushion layer CS may be formed by providing a foaming agent on the barrier film.

The metal layer ML may be attached to the cushion layer CS by an eighth adhesive layer AL8. The eighth adhesive layer AL8 may include a first portion AL8-1 corresponding to the first cushion layer CS1 and a second portion AL8-2 corresponding to the second cushion layer CS2.

The metal plate MP may be located under the cushion layer CS. The metal plate MP may include a first metal plate MP1 and a second metal plate MP2, which respectively overlap the first cushion layer CS1 and the second cushion layer CS2. The metal plate MP may absorb the external impact applied thereto from a lower side. The metal plate MP may have a strength higher than that of the metal layer ML and may have a thickness greater than that of the metal layer ML. The metal plate MP may include a metal material such as stainless steel.

The cushion layer CS may be attached to the metal plate MP by a ninth adhesive layer AL9. The ninth adhesive layer AL9 may include a first portion AL9-1 and a second portion AL9-2, which respectively correspond to the first metal plate MP1 and the second metal plate MP2.

The heat dissipation layer HRP may be located under the metal plate MP. The heat dissipation layer HRP may include a first heat dissipation layer HRP1 and a second heat dissipation layer HRP2, which respectively overlap the first metal plate MP1 and the second metal plate MP2.

The heat dissipation layer HRP may dissipate heat generated from electronic components located thereunder. The electronic components may be the electronic module EM shown in FIGS. 2A and 2B. The heat dissipation layer HRP may have a structure in which an adhesive layer and a graphite layer are alternately stacked with each other. The heat dissipation layer HRP may be attached to the metal plate MP by an additional adhesive layer located between the heat dissipation layer HRP and the metal plate MP.

The magnetic field shielding sheet MSM may be located under the metal plate MP. The magnetic field shielding sheet MSM may shield a magnetic field generated from a magnetic substance located thereunder. The magnetic field shielding sheet MSM may prevent or reduce instances of the magnetic field generated from the magnetic substance interfering with the digitizer DTM.

The magnetic field shielding sheet MSM may include a plurality of portions. At least some portions of the portions may have different thicknesses from the other portions. The portions of the magnetic field shielding sheet MSM may be located to correspond to a step difference of a bracket located under the display device DD. The magnetic field shielding sheet MSM may have a structure in which a magnetic field shielding layer and an adhesive layer are alternately stacked with each other. A portion of the magnetic field shielding sheet MSM may be directly attached to the metal plate MP.

The step difference compensation member AS may be coupled to a lower portion of the seventh adhesive layer AL7. The step difference compensation member AS may be a double-sided tape or an insulating film. The step difference compensation member AS may include a first step difference compensation member AS1 and a second step difference compensation member AS2 to compensate for a step difference between components included in the lower member LM.

The functional layers of the lower member LM, which are located under the first non-folding portion DTM-1 and the second non-folding portion DTM-2, may be located spaced apart from each other with the gap (e.g., a set or predetermined gap) GP in an area overlapping the folding portion DTM-F. The gap GP may be within a range from 0.3 mm to 3 mm (or about 0.3 mm to about 3 mm).

Some members of the lower member LM may be provided with a through hole LTH defined therethrough. The through hole LTH may be defined to overlap the sensing area DP-TA of FIG. 2A. As shown in FIG. 5A, the through hole LTH may penetrate from the fifth adhesive layer AL5 to the metal plate MP. As the through hole LTH is formed, the light blocking structure may be removed from a path of the optical signal, and the through hole LTH may relatively improve an efficiency in optical signal reception of the electro-optical module ELM.

At least one of the metal layer ML, the cushion layer CS, the metal plate MP, or the step difference compensation member AS may be omitted from the electronic device ED, and embodiments according to the present disclosure should not be particularly limited.

Figure 6A:
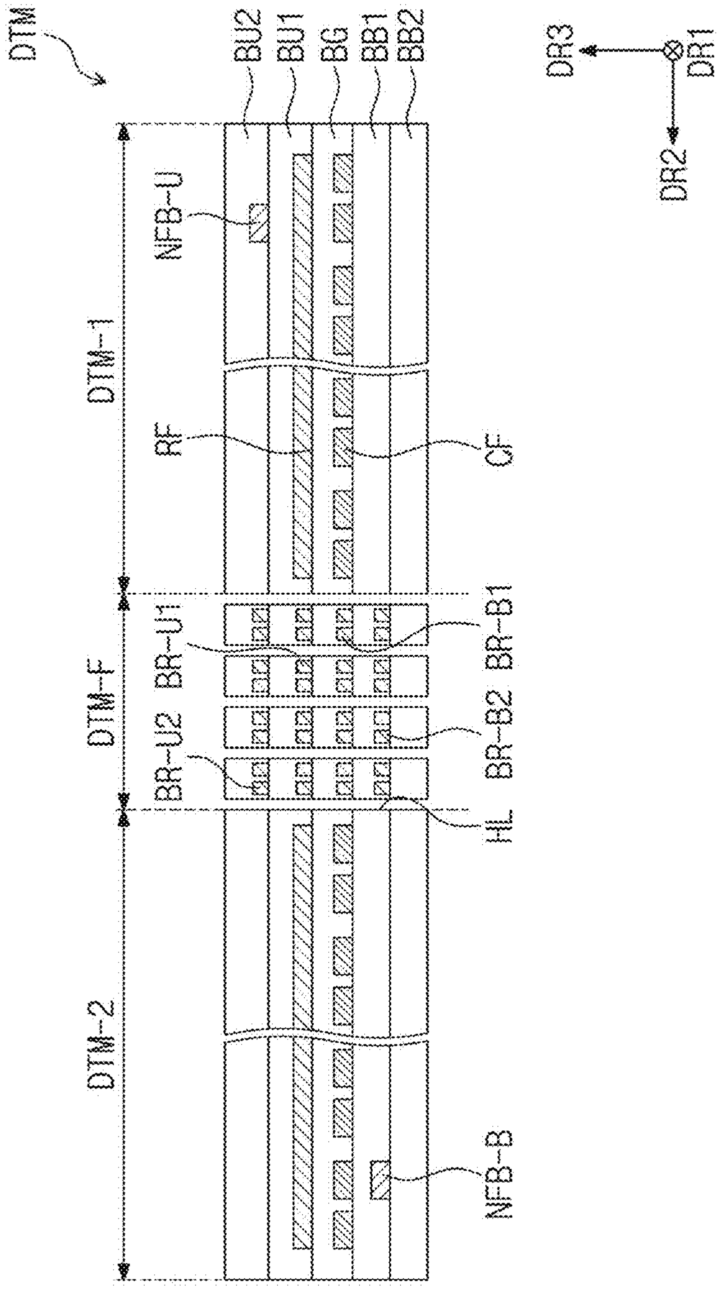
FIG. 6A is a cross-sectional view of a digitizer according to some embodiments of the present disclosure.
Figure 6B:
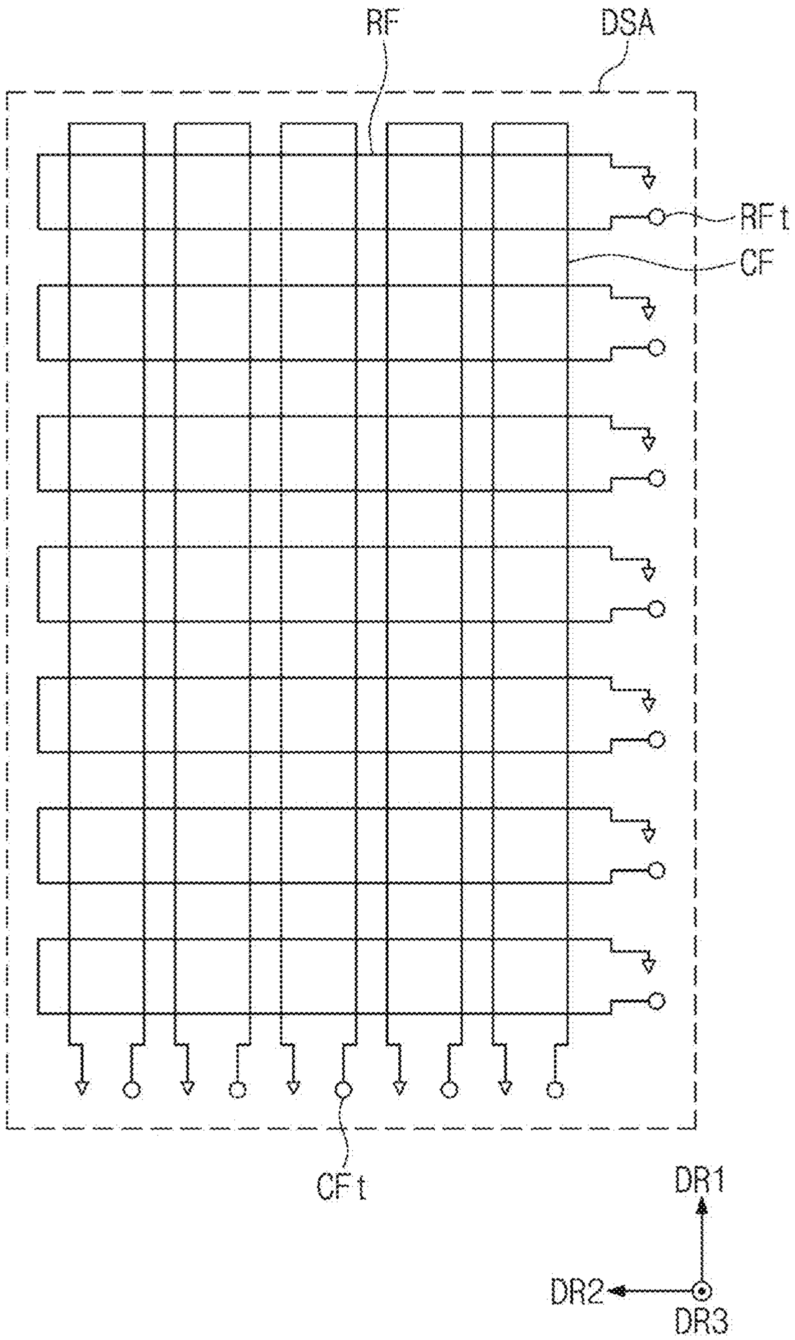
FIG. 6B is a plan view of a sensing area of a digitizer according to some embodiments of the present disclosure.

FIG. 6A is a cross-sectional view of the digitizer DTM according to some embodiments of the present disclosure, and FIG. 6B is a plan view of a sensing area of the digitizer according to some embodiments of the present disclosure.

Referring to FIG. 6A, the digitizer DTM may include a base portion BM including a plurality of base layers BG, BU1, BU2, BB1, and BB2, first sensing coils RF, second sensing coils CF, and connection lines BR-U1, BR-U2, BR-B1, and BR-B2.

In the following descriptions, the term ‘folding lines’ may be used as a general term for coils arranged in the folding portion DTM-F of the digitizer DTM. Lines that connect the first sensing coils RF spaced apart from each other with the folding portion DTM-F interposed therebetween may be referred to as the ‘folding lines’ and lines that are connected to the second sensing coils CF when a portion of the second sensing coils CF is located on at least one of the first non-folding portion DTM-1 or the second non-folding portion DTM-2 and the other portion of the second sensing coils CF is located on the folding portion DTM-F to form an open-loop may be referred to as the ‘folding lines’. The folding lines may be portions of the first sensing coils RF or portions of the second sensing coils CF, however, in the following descriptions, the folding lines will be described as a separate configuration for clarity in describing aspects of some embodiments of the present disclosure and for convenience of explanation.

Each of the first sensing coils RF and the second sensing coils CF may be insulated from each other and may form an open loop. Each of the first sensing coils RF and each of the second sensing coils CF may rotate at least twice to form the open loop.

Portions of each of the first sensing coils RF may overlap portions of other first sensing coils RF when viewed in the plane (e.g., in a plan view), and the overlapped portions may be connected to each other by contact lines NFB-U and NFB-B via another layer. As an example, the overlapped portions of the first sensing coils RF may be connected to an upper contact line NFB-U located on the first upper base layer BU1 to form the open loop.

In addition, portions of the second sensing coils CF, which intersect each other, may be connected to a lower contact line NFB-B located on a second lower base layer BB2 to form the open loop, however, embodiments according to the present disclosure should not be limited thereto or thereby. The contact lines NFB-U and NFB-B may be located on one base layer among the base layers BG, BU1, BU2, BB1, and BB2 as long as the coils intersecting each other form the open loop, and they should not be limited thereto or thereby.

In FIG. 6A, for the convenience of explanation, the contact lines NFB-U and NFB-B are shown as being floated. However, each of the contact lines NFB-U and NFB-B may be provided in plural and may be connected to corresponding first sensing coils RF and corresponding second sensing coils CF via contact holes defined through at least one of the base layers BG, BU1, BU2, BB1, or BB2.

Each of the first sensing coils RF and the second sensing coils CF may include one of copper and copper plating.

FIG. 6A shows a structure in which the first sensing coils RF are located on the first upper base layer BU1 and the second sensing coils CF are located on the first lower base layer BB1, however, embodiments according to the present disclosure should not be limited thereto or thereby. According to some embodiments, the first sensing coils RF and the second sensing coils CF may be located on at least one of the base layers BG, BU1, BU2, or BB1.

Each of the base layers BG, BU1, BU2, BB1, and BB2 may include a matrix containing fillers and fiber lines that are woven and located within the matrix.

Figure 12A:
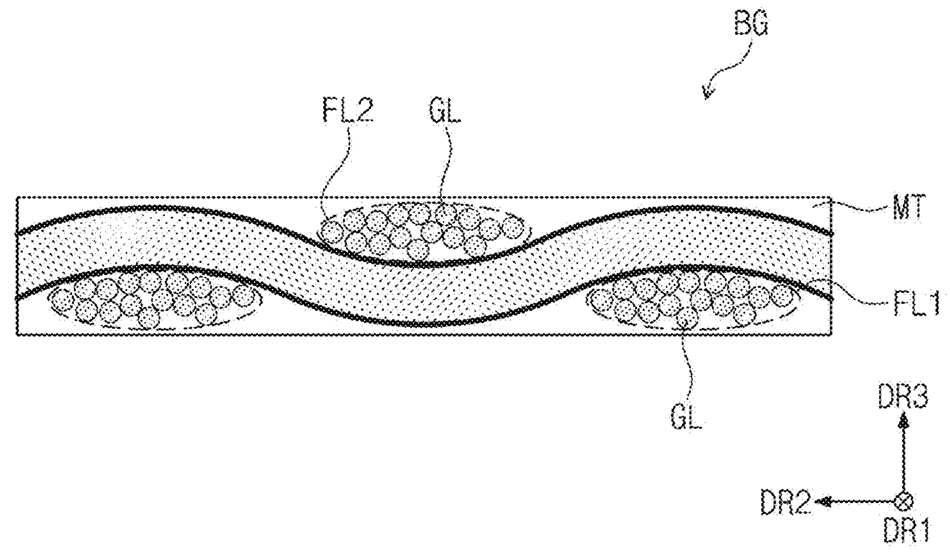
FIG. 12A is a cross-sectional view of a base layer included in a digitizer according to some embodiments of the present disclosure.
Figure 12B:
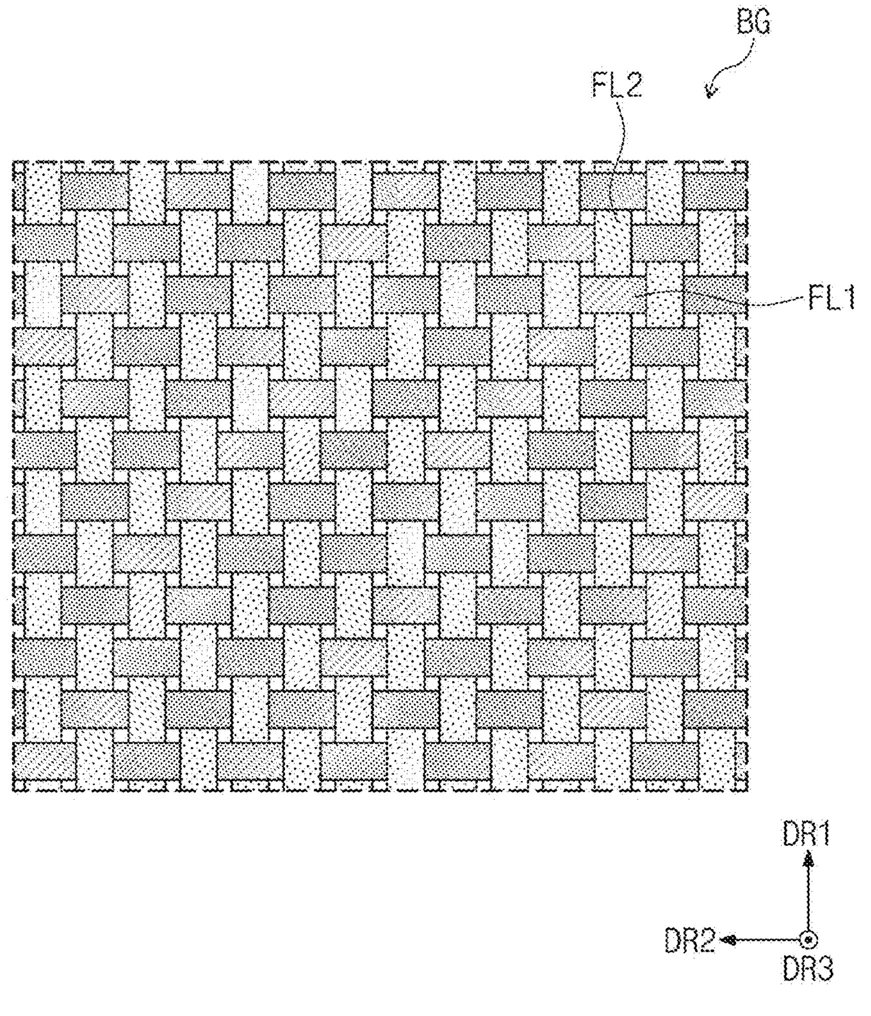
FIG. 12B is a plan view of a base layer included in a digitizer according to some embodiments of the present disclosure.

FIG. 12A is a cross-sectional view of the base layer BG included in the digitizer according to some embodiments of the present disclosure, and FIG. 12B is a plan view of the base layer BG included in the digitizer according to some embodiments of the present disclosure. Descriptions on the base layer BG with reference to FIGS. 12A and 12B may be applied to the base layers BG, BU1, BU2, BB1, and BB2 described with reference to FIGS. 6A and 6B.

Referring to FIGS. 12A and 12B, the base layer BG may include the matrix MT containing the fillers and the fiber lines FL1 and FL2 that are woven and located within the matrix MT.

The fiber lines FL1 and FL2 may be alternately arranged with each other in the first direction DR1 and the second direction DR2 and thus may have a fabric shape when viewed in the plane (e.g., in a plan view). Each of the fiber lines FL1 and FL2 may have a bundle of multiple fibers GL. A single strand fiber GL included in one fiber line may have a diameter equal to or greater than 3 um (or about 3 um) and equal to or smaller than 10 um (or about 10 um).

Each of the fiber lines FL1 and FL2 may have a reinforced fiber composite. The reinforced fiber composite may be one of a carbon fiber-reinforced plastic (CFRP) and a glass fiber-reinforced plastic (GFRP). The fiber lines FL1 and FL2 may be located in the matrix MT.

The matrix MT may include at least one of epoxy, polyester, polyamide, polycarbonate, polypropylene, polybutylene, or vinyl ester.

The matrix MT may include the filler. The filler may include at least one of silica, barium sulphate, sintered talc, barium titanate, titanium oxide, clay, alumina, mica, boehmite, zinc borate, or zinc tin oxide.

According to the present disclosure, as the base layer BG included in the digitizer DTM (refer to FIG. 6A) includes a fiber bundle of glass fiber reinforced plastic or a fiber bundle of carbon fiber reinforced plastic placed inside the matrix MT, a lower portion of the display device DD (refer to FIG. 5B) may be protected when the display device DD (refer to FIG. 5B) is folded.

Accordingly, the digitizer DTM (refer to FIG. 6A) may be configured to function as a protective member and to perform a pen detection. Therefore, a separate metal plate that protects the display device DD may be omitted, and as a result, a manufacturing cost of the display device DD may be relatively reduced, and the electronic device ED may have a slim profile.

Referring to FIG. 6B, the first sensing coils RF and the second sensing coils CF may be arranged in the sensing area DSA of the digitizer DTM. The first sensing coils RF may be referred to as driving coils, and the second sensing coils CF may be referred to as sensing coils, however, embodiments according to the present disclosure should not be limited thereto or thereby. The sensing area DSA may correspond to an active area AA of FIG. 7A or may correspond to a portion where the input of the stylus pen is sensed in the active area AA.

Each of the first sensing coils RF may include long side coils and a short side coil. Each of the long side coils may extend in the second direction DR2, and the long side coils may be spaced apart from each other in the first direction DR1. The short side coil may be connected to an end of each of the long side coils forming one loop and may connect the long side coils spaced apart from each other.

FIG. 6B shows each of the first sensing coils RF as one loop, however, each of the first sensing coils RF may be a loop coil with two or more turns. In this case, portions overlapping each other when viewed in the plane (e.g., in a plan view) may be located on different layers from each other and may be connected to each other via contact holes defined through the base layer.

In addition, FIG. 6B shows a structure in which the first sensing coils RF each forming one loop are spaced apart from each other, however, the present disclosure should not be limited thereto or thereby. According to some embodiments, long side coils included in the coils adjacent to each other among the first sensing coils RF may be alternately arranged with each other.

Each of the second sensing coils CF may include long side coils and a short side coil. Each of the long side coils may extend in the first direction DR1, and the long side coils may be spaced apart from each other in the second direction DR2. The short side coil may be connected to an end of each of the long side coils forming one loop and may connect the long side coils spaced apart from each other.

FIG. 6B shows each of the second sensing coils CF as one loop, however, each of the second sensing coils CF may be a loop coil with two or more turns. In this case, portions overlapping each other when viewed in the plane (e.g., in a plan view) may be located on different layers from each other and may be connected to each other via contact holes defined through the base layer.

FIG. 6B shows a structure in which the second sensing coils CF each forming one loop are spaced apart from each other, however, embodiments according to the present disclosure should not be limited thereto or thereby. According to some embodiments, long side coils included in the coils adjacent to each other among the second sensing coils CF may be alternately arranged with each other.

Alternating current signals may be provided sequentially to second terminals CFt of the second sensing coils CF. The other terminals of the second sensing coils CF different from the second terminals CFt may be grounded. Signal lines may be connected to the second terminals CFt of the second sensing coils CF, respectively.

When a current flows through the second sensing coils CF, a magnetic line of force may be induced between the second sensing coils CF and the first sensing coils RF. The first sensing coils RF may sense an induced electromagnetic force emitted from the stylus pen and may output the sensed signal to first terminals RFt of the first sensing coils RF. The other terminals of the first sensing coils RF different from the first terminals RFt may be grounded. Signal lines may be connected to the first terminals RFt of the first sensing coils RF, respectively.

According to the present disclosure, as the folding lines are also located in the folding portion DTM-F of the digitizer DTM, the input generated by the stylus pen may be sensed in the folding portion DTM-F.

Figure 7A:
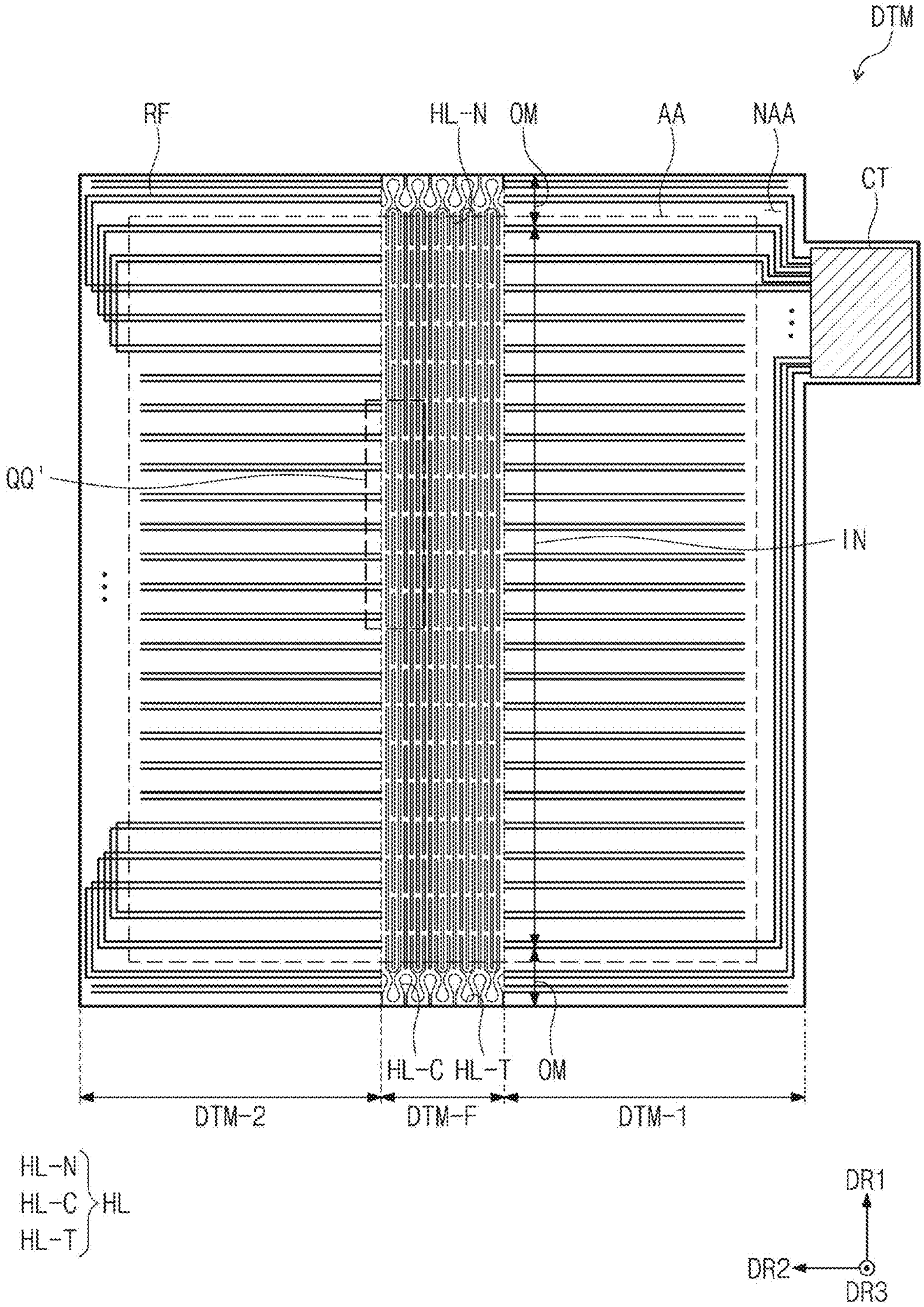
FIG. 7A is a plan view of a digitizer according to some embodiments of the present disclosure.
Figure 7B:
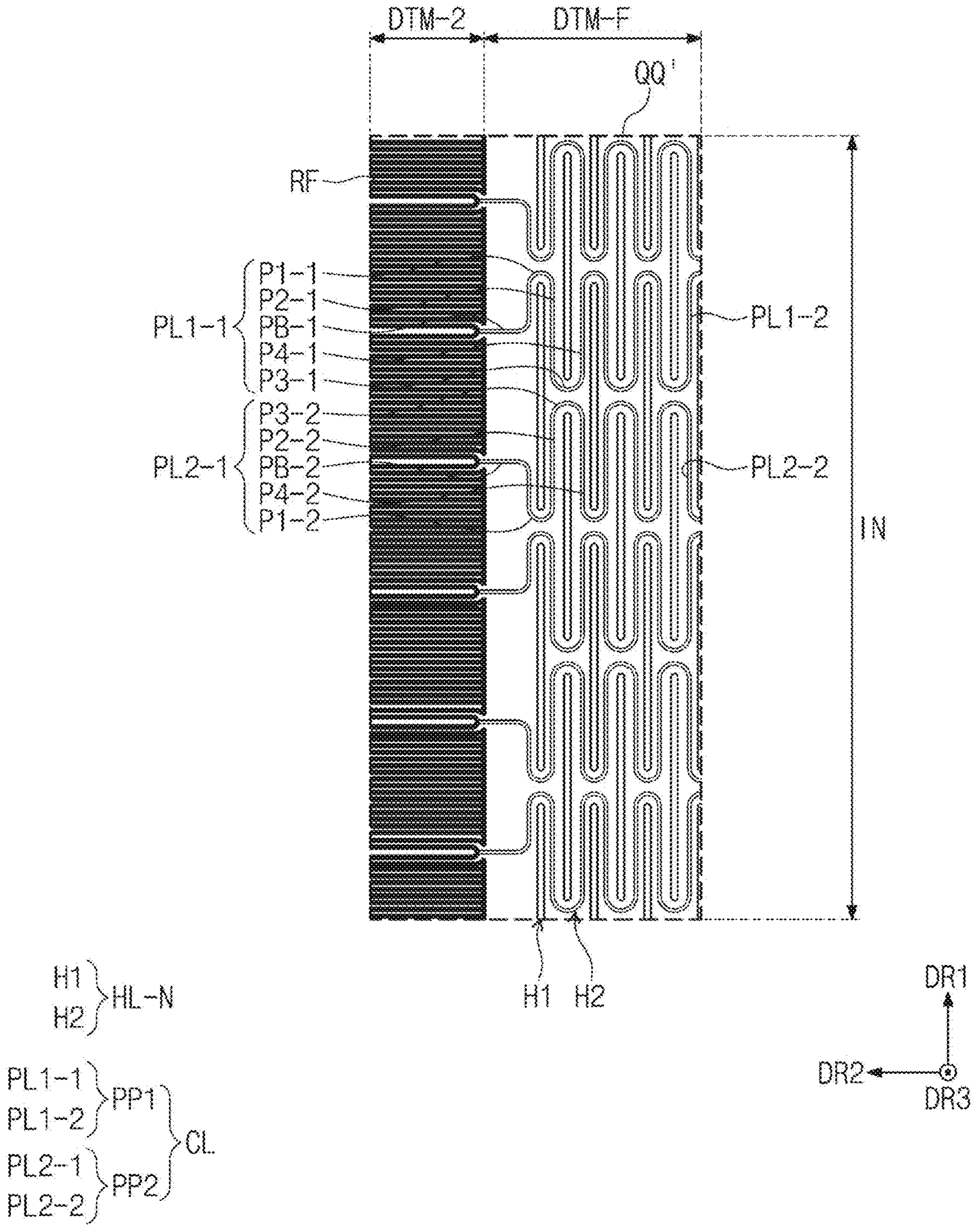
FIG. 7B is a plan view of a portion QQ' of FIG. 7A.

FIG. 7A is a plan view of a digitizer according to some embodiments of the present disclosure, and FIG. 7B is an enlarged plan view of a portion QQ' of FIG. 7A.

Referring to FIG. 7A, each of the first sensing coils RF may include long sides extending in the second direction DR2 and short sides extending in the first direction DR1 and connected to corresponding long sides. Most of the long sides may be located in the active area AA. Most of the short sides may be located in a peripheral area NAA, and some short sides may be located in the active area AA.

Each of the first sensing coils RF may rotate at least twice, and one of one end and the other end of each of the first sensing coils RF may be connected to a connector CT. At least portions of coils that sense different signals and are adjacent to each other among the first sensing coils RF may overlap each other and intersect with each other. As the first sensing coils RF overlap each other, intersection points where the coils intersect with each other when viewed in the plane (e.g., in a plan view) may be formed. One first sensing coil RF may be connected to another first sensing coil RF at a corresponding intersection point by the contact lines NFB-U and NFB-B via another layer.

The folding portion DTM-F may include a center portion IN that overlaps the active area AA and outer portions OM spaced apart from each other with the center portion IN interposed therebetween in the first direction DR1. Each of the outer portions OM may protrude from the center portion IN toward a direction parallel to the first direction DR1.

Hereinafter, for the convenience of explanation, descriptions will focus on one outer portion OM located at an upper end of the folding portion DTM-F, and descriptions on the outer portion OM located at the upper end may be applied to an outer portion OM located at a lower end of the folding portion DTM-F.

First holes HL-N may be formed through the center portion IN, and second holes HL-T and third holes HL-C may be formed through the outer portion OM. The first holes HL-N, the second holes HL-T, and the third holes HL-C may be formed through the digitizer DTM from the upper surface of the second upper base layer BU2 to a lower surface of the second lower base layer BB2 described with reference to FIG. 6A. According to the present disclosure, the first holes HL-N, the second holes HL-T, and the third holes HL-C may have different shapes from each other, and this will be described in detail later.

According to the present disclosure, the folding lines may also be arranged in the outer portions OM to allow the sensing performance of the folding portion DTM-F to be similar to or the same as the sensing performance of the first and second non-folding portions DTM-1 and DTM-2, and this will be described in detail later.

FIG. 7B shows an arrangement relationship between the center lines CL located in the center portion IN among the folding lines located in the folding portion DTM-F and the first sensing coils RF adjacent to the center portion IN.

According to some embodiments, the first holes HL-N formed through the center portion IN of the folding portion DTM-F may include first group holes H1 and second group holes H2. As an example, the first group holes H1 may include a plurality of holes each extending in the first direction DR1 and arranged in the first direction DR1.

The second group holes H2 may be spaced apart from the first group holes H1 in the second direction DR2 and may include a plurality of holes each extending in the first direction DR1 and arranged in the first direction DR1.

According to some embodiments, the second group hole H2 may be shifted from the first group hole H1 in the first direction DR1 by a distance (e.g., a set or predetermined distance). A remaining portion of the folding portion DTM-F except the first holes HL-N may have a slit shape with a lattice pattern.

The center lines CL may include first group patterns PP1 and second group patterns PP2. The first group pattern PP1 may be alternately arranged with the second group pattern PP2 in the first direction DR1.

Each of the first group pattern PP1 and the second group pattern PP2 may include two lines. Accordingly, four or less center lines CL may be located between the holes located adjacent to each other in the first direction DR1 among the holes included in the first group hole H1 and the second group hole H2.

The first group pattern PP1 and the second group pattern PP2 may be located between the first holes HL-N and may be symmetrical with each other based on an imaginary line extending in the second direction DR2.

The first group pattern PP1 may include a first-first line PL1-1 and a first-second line PL1-2. Each of the first-first line PL1-1 and the first-second line PL1-2 may include a plurality of patterns PB-1, P1-1, P2-1, P3-1, and P4-1. Hereinafter, the patterns PB-1, P1-1, P2-1, P3-1, and P4-1 included in the first-first line PL1-1 will be described, and descriptions on the patterns PB-1, P1-1, P2-1, P3-1, and P4-1 included in the first-first line PL1-1 may be applied to the patterns PB-1, P1-1, P2-1, P3-1, and P4-1 included in the first-second line PL1-2. The patterns PB-1, P1-1, P2-1, P3-1, and P4-1 may be a portion of one coil extending from the first sensing coil (non-folding coil) RF, however, for the convenience of explanation, the patterns PB-1, P1-1, P2-1, P3-1, and P4-1 will be described as separate elements.

A first bridge pattern PB-1 may be connected to one end of the first sensing coil (non-folding coil) RF. The first bridge pattern PB-1 may extend in the second direction DR2. One end of the first bridge pattern PB-1 may be connected to one end of the first sensing coil (non-folding coil) RF, and the other end of the first bridge pattern PB-1 may be connected to one end of a first-first pattern P1-1.

The first-first pattern P1-1 may be located at an upper end of one hole of the first group hole H1. The first-first pattern P1-1 may have a convex shape in the first direction DR1. The other end of the first-first pattern P1-1 may be connected to one end of a first-second pattern P2-1.

The first-second pattern P2-1 may extend in the first direction DR1. The first-second pattern P2-1 may be located between a first hole of the first group hole H1 and a second hole of the second group hole H2, which face the first hole in the second direction DR2. The other end of the first-second pattern P2-1 may be connected to one end of a first-third pattern P3-1.

The first-third pattern P3-1 may be located at a lower end of the second hole of the second group hole H2. The first-third pattern P3-1 may have a concave shape in the first direction DR1. The other end of the first-third pattern P3-1 may be connected to one end of a first-fourth pattern P4-1.

The first-fourth pattern P4-1 may extend in the first direction DR1. The first-fourth pattern P4-1 may be located between the second hole of the second group hole H2 and a third hole of the first group hole H1, which faces the second hole in the second direction DR2. The other end of the first-fourth pattern P4-1 may be connected to one end of another first-first pattern P1-1 following the first-fourth pattern P4-1.

The second group pattern PP2 may include a second-first line PL2-1 and a second-second line PL2-2. Each of the second-first line PL2-1 and the second-second line PL2-2 may include a plurality of patterns PB-2, P1-2, P2-2, P3-2, and P4-2. Hereinafter, the patterns PB-2, P1-2, P2-2, P3-2, and P4-2 included in the second-first line PL2-1 will be mainly described, and descriptions on the patterns PB-2, P1-2, P2-2, P3-2, and P4-2 included in the second-first line PL2-1 may be applied to the patterns PB-2, P1-2, P2-2, P3-2, and P4-2 included in the second-second line PL2-2. The patterns PB-2, P1-2, P2-2, P3-2, and P4-2 may be a portion of another coil extending from the first sensing coil (non-folding coil) RF, however, for the convenience of explanation, the patterns PB-2, P1-2, P2-2, P3-2, and P4-2 will be described as separate elements.

A second bridge pattern PB-2 may be connected to one end of the first sensing coil (non-folding coil) RF. The second bridge pattern PB-2 may extend in the second direction DR2. One end of the second bridge pattern PB-2 may be connected to one end of the first sensing coil (non-folding coil) RF, and the other end of the second bridge pattern PB-2 may be connected to one end of the second-first pattern P1-2.

The second-first pattern P1-2 may be located at a lower end of the hole of the first group hole H1, and the first-first pattern P1-1 is located at the upper end of the hole of the first group hole H1. The second-first pattern P1-2 may have a concave shape in the first direction DR1. The other end of the second-first pattern P1-2 may be connected to one end of a second-second pattern P2-2.

The second-second pattern P2-2 may extend in the first direction DR1. The second-second pattern P2-2 may be located between the first hole of the first group hole H1 and a fourth hole of the second group hole H2, which faces the first hole in the second direction DR2. The second hole and the fourth hole of the second group hole H2 may be adjacent to each other in the first direction DR1. The other end of the second-second pattern P2-2 may be connected to one end of a second-third pattern P3-2.

The second-third pattern P3-2 may be located at an upper end of the fourth hole of the second group hole H2. The second-third pattern P3-2 may have a convex shape in the first direction DR1. The other end of the second-third pattern P3-2 may be connected to one end of a second-fourth pattern P4-2.

The second-fourth pattern P4-2 may extend in the first direction DR1. The second-fourth pattern P4-4 may be located between the second hole of the second group hole H2 and a fifth hole of the first group hole H1, which faces the second hole in the second direction DR2. The third hole may be adjacent to the fifth hole in the first direction DR1. The other end of the second-fourth pattern P4-2 may be connected to one end of a second-first pattern P1-2 that is repeated.

Figure 8A:
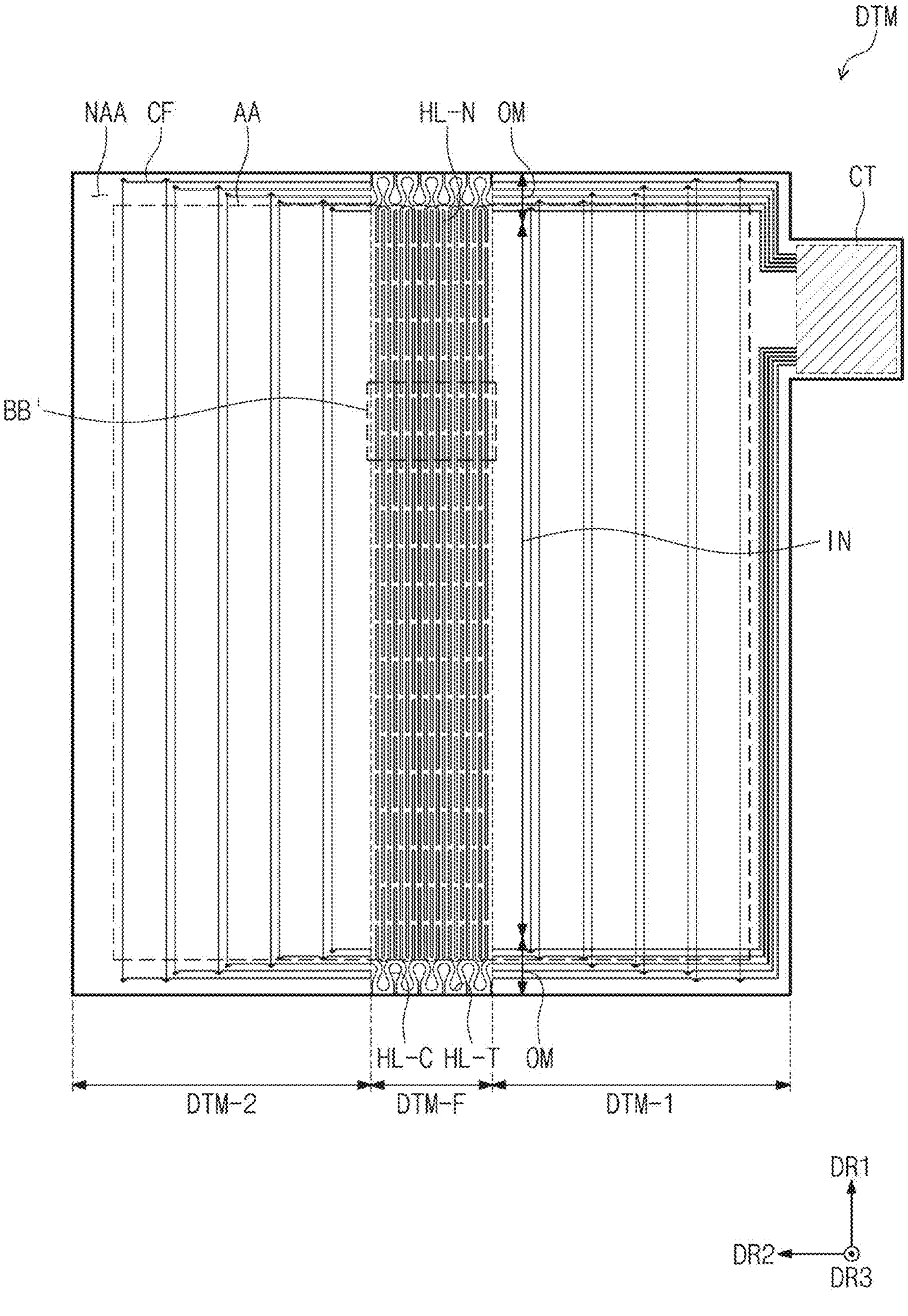
FIG. 8A is a plan view of a digitizer according to some embodiments of the present disclosure.
Figure 8B:
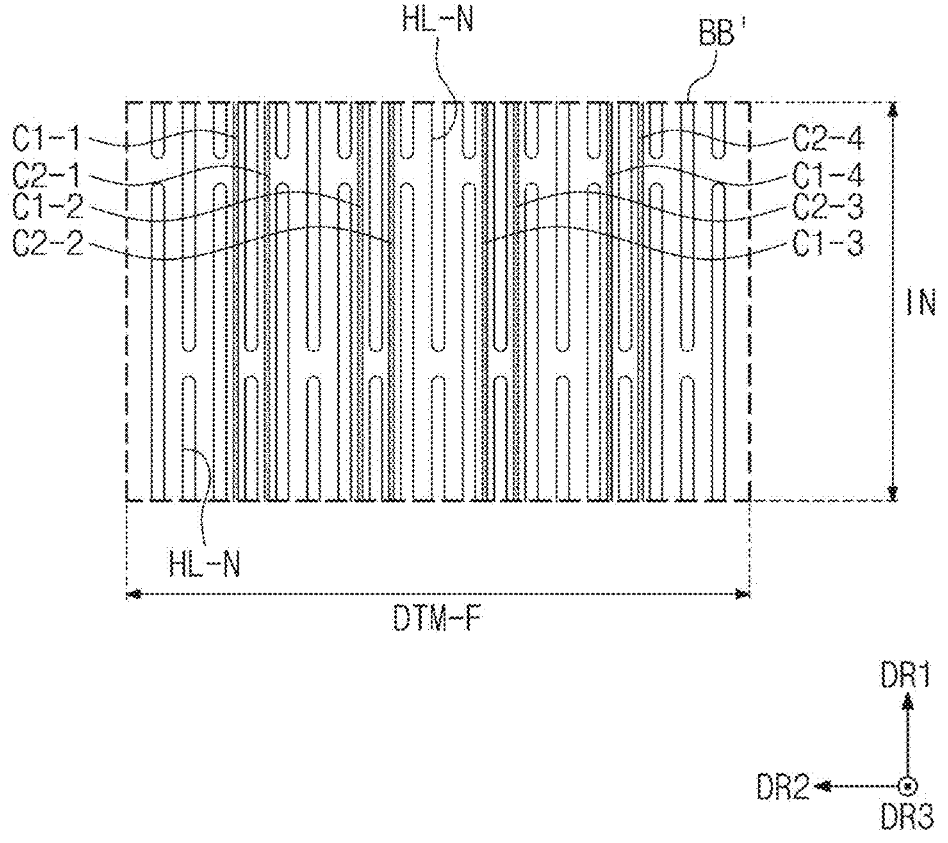
FIG. 8B is an enlarged plan view of a portion BB' of FIG. 8A.
Figure 9:
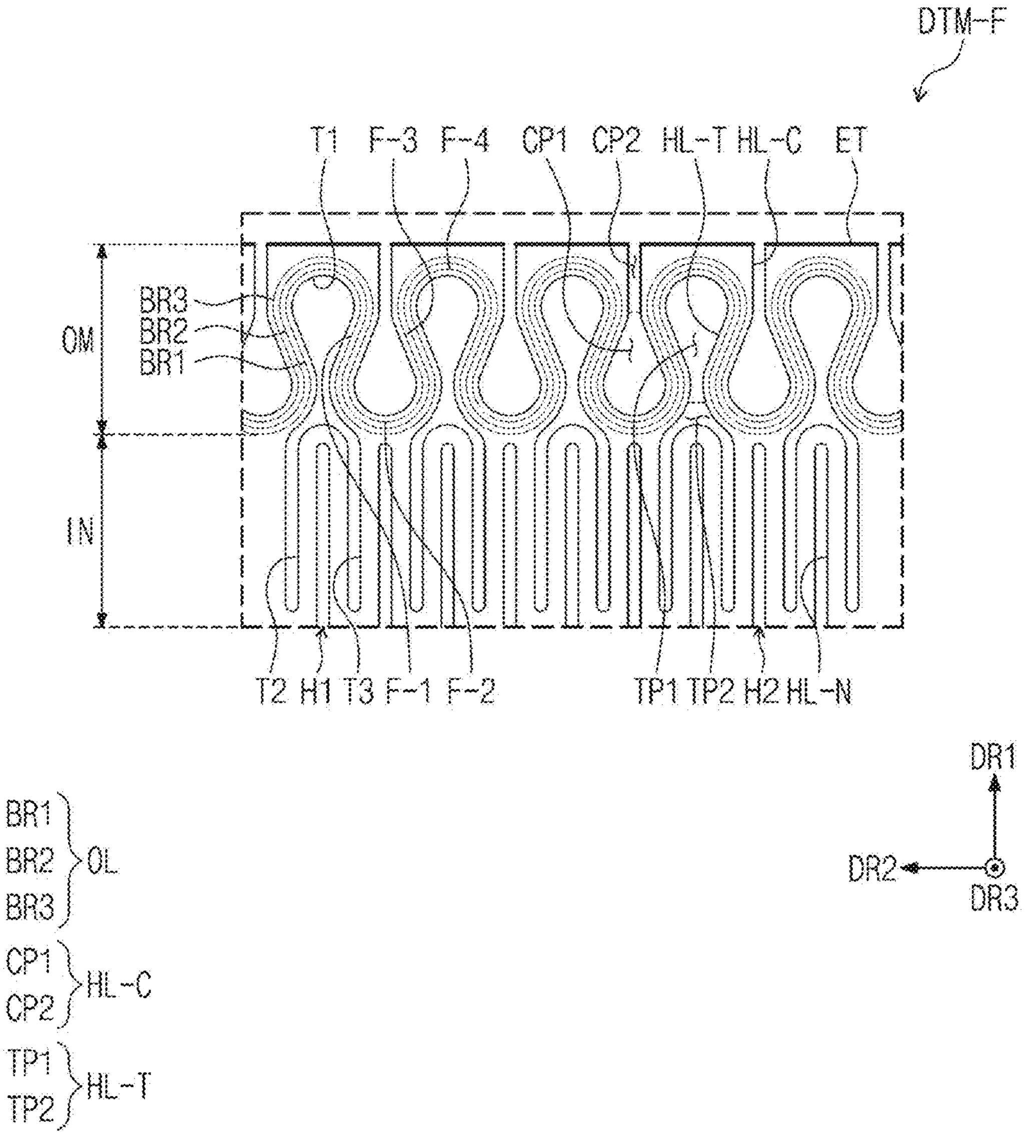
FIG. 9 is a plan view of a portion of a digitizer according to some embodiments of the present disclosure.
Figure 10:
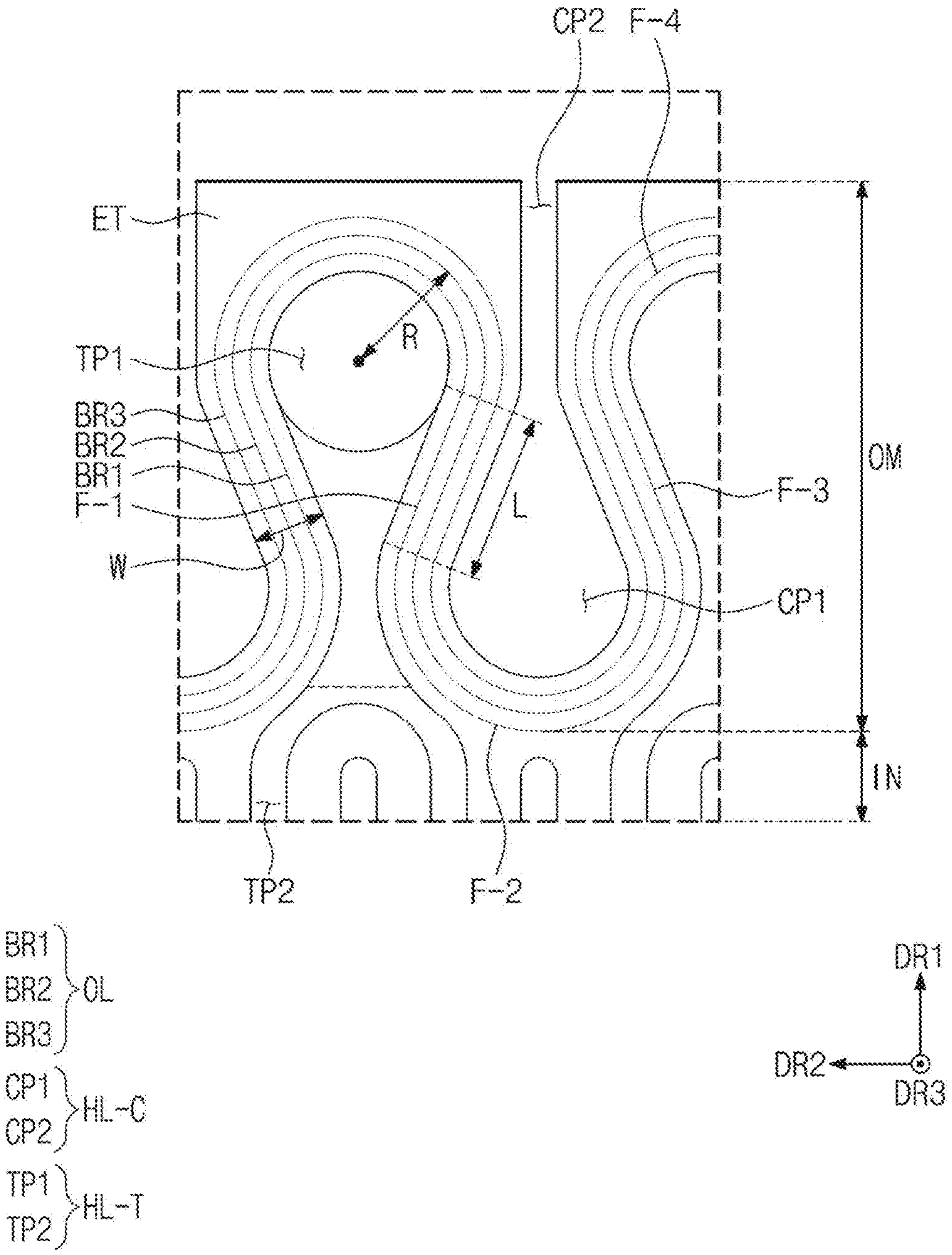
FIG. 10 is an enlarged plan view of a portion of FIG. 9.

FIG. 8A is a plan view of a digitizer DTM according to some embodiments of the present disclosure, and FIG. 8B is an enlarged plan view of a portion BB' of FIG. 8A. FIG. 9 is a plan view of a portion of a digitizer according to some embodiments of the present disclosure, and FIG. 10 is an enlarged plan view of a portion of FIG. 9.

Referring to FIG. 8A, each of the second sensing coils CF may include long sides extending in the first direction DR1 and short sides extending in the second direction DR2 and connected to corresponding long sides. Most of the long sides may be located in an active area AA, and most of the short sides may be located in a peripheral area NAA.

Each of the second sensing coils CF may rotate at least twice to form an open loop, and one of one end and the other end of each of the second sensing coils CF may be connected to a connector CT. At least portions of coils that sense different signals and are adjacent to each other among the second sensing coils CF may overlap each other and intersect with each other. As the second sensing coils CF overlap each other, intersection points where the coils intersect with each other when viewed in the plane (e.g., in a plan view) may be formed. One second sensing coil CF may be connected to another second sensing coil CF at a corresponding intersection point by the contact lines NFB-U and NFB-B via another layer.

FIG. 8B shows folding lines C1-1, C1-2, C1-3, C1-4, C2-1, C2-2, C2-3, and C2-4 located in the center portion IN of the folding portion DTM-F. The folding lines C1-1, C1-2, C1-3, C1-4, C2-1, C2-2, C2-3, and C2-4 may be one of the folding lines BR-U1, BR-U2, BR-B1, and BR-B2 described with reference to FIG. 6A.

At least one folding line of the folding lines C1-1, C1-2, C1-3, C1-4, C2-1, C2-2, C2-3, and C2-4 may be connected to some of the second sensing coils CF located in the first non-folding portion DTM-1, and another folding line of the folding lines C1-1, C1-2, C1-3, C1-4, C2-1, C2-2, C2-3, and C2-4 may be connected to some of the second sensing coils CF located in the second non-folding portion DTM-2.

Each of first group folding lines C1-1, C1-2, C1-3, and C1-4 and second group folding lines C2-1, C2-2, C2-3, and C2-4 may extend in the first direction DR1 and may be located between the first holes HL-N adjacent to each other in the second direction DR2. When viewed in the plane (e.g., in a plan view), the first group folding lines C1-1, C1-2, C1-3, and C1-4 may be alternately arranged with the second group folding lines C2-1, C2-2, C2-3, and C2-4 in the second direction DR2. According to some embodiments, the first group folding lines C1-1, C1-2, C1-3, and C1-4 and the second group folding lines C2-1, C2-2, C2-3, and C2-4 may be located on the same layer or on different layers, and they should not be particularly limited.

In the folding lines C1-1, C1-2, C1-3, C1-4, C2-1, C2-2, C2-3, and C2-4 connected to the second sensing coils CF among the folding lines located in the folding portion DTM-F, one coil may be located between the holes HL-N adjacent to each other in the second direction DR2.

However, the present disclosure should not be limited thereto or thereby. According to some embodiments, the folding lines C1-1, C1-2, C1-3, C1-4, C2-1, C2-2, C2-3, and C2-4 connected to the second sensing coils CF and located at the center portion IN may have the same (or substantially the same) shape as the patterns included in the first group pattern PP1 and the second group pattern PP2 described with reference to FIG. 7B, and they should not be limited thereto or thereby.

FIG. 9 shows an arrangement relationship of outer lines OL located in the outer portion OM among the folding lines located in the folding portion DTM-F.

Referring to FIG. 9, the second holes HL-T and the third holes HL-C may be defined through the outer portion OM of the folding portion DTM-F. According to the present disclosure, the first hole HL-N, the second hole HL-T, and the third hole HL-C defined through the folding portion DTM-F may have different shapes from each other.

The first holes HL-N may correspond to the first holes HL-N described with reference to FIG. 7B. Each of the first holes HL-N may extend in the first direction DR1, and the holes included in different groups may be alternately arranged and may be shifted to the first direction DR1.

The second holes HL-T may be spaced apart from each other in the second direction DR2. Each of the second holes HL-T may be divided into a first portion TP1 and a second portion TP2. The first portion TP1 may overlap the outer portion OM, and the second portion TP2 may overlap the center portion IN. The second portion TP2 may may surround a portion of the first holes HL-N adjacent to a boundary between the center portion IN and the outer portion OM when viewed in the plane (e.g., in a plan view).

Each of the second holes HL-T may include a first hole T1, a second hole T2, and a third hole T3. The first hole T1, the second hole T2, and the third hole T3 may be openings that form (or substantially form) a single hole but may be distinguished from each other for the convenience of explanation. The first hole T1 may overlap the first portion TP1, and the second hole T2 and the third hole T3 may overlap the second portion TP2.

The first hole T1 may be aligned with the first group hole H1 adjacent with the outer portion OM in the first direction DR1 among the first group holes H1. The second hole T2 may be connected to the first hole T1 and may be located at a left side of the first group hole H1. The third hole T3 may be connected to the first hole T1 and may be located at a right side of the first group hole H1. Accordingly, the second hole T2 may be spaced apart from the third hole T3 with the first group hole H1 interposed therebetween.

The third holes HL-C may be aligned with the second group holes H2 in the first direction DR1. The third holes HL-C may be arranged at an edge ET of the outer portion OM in the second direction DR2 and may have a partially opened shape. Accordingly, each of the third holes HL-C may have an open opening. The second holes HL-T and the third holes HL-C may be alternately arranged with each other along the second direction DR2.

Each of the third holes HL-C may be divided into a first portion CP1 and a second portion CP2. The first portion CP1 may be alternately arranged with the first portion TP1 of each of the second holes HL-T in the second direction DR2. The second portion CP2 may be arranged at the edge ET of the outer portion OM and may form the open opening. A width in the second direction DR2 between side surfaces of the outer portion OM, which define the second portion CP2, may be uniform.

According to the present disclosure, when viewed in the plane (e.g., in a plan view), the first portion TP1 of each of the second holes HL-T and the first portion CP1 of each of the third holes HL-C may have a droplet shape convex in opposite directions.

In more detail, the first portion TP1 of each of the second holes HL-T may have the convex shape in a direction away from the center portion IN. The first portion CP1 of each of the third holes HL-C may have the convex shape in a direction approaching the center portion IN.

In the outer portion OM, the outer line OL may be located on three base layers among the base layers BG, BU1, BU2, and BB1.

The outer line OL located on one base layer may include first, second, and third outer lines BR1, BR2, and BR3.

The first, second, and third outer lines BR1, BR2, and BR3 may be lines that connect the coils located in the peripheral area NAA of the first non-folding portion DTM-1 and the second non-folding portion DTM-2 among the first sensing coils RF described with reference to FIG. 7A or may be lines that connect the coils located in the peripheral area NAA of the first non-folding portion DTM-1 and the second non-folding portion DTM-2 among the second sensing coils CF described with reference to FIG. 8A.

Each of the first, second, and third outer lines BR1, BR2, and BR3 may include first, second, third, and fourth lines F-1, F-2, F-3, and F-4. The first, second, third, and fourth lines F-1, F-2, F-3, and F-4 may be connected to each other, however, for the convenience of explanation, they are described as separate elements.

The first line F-1 and the third line F-3 may have a line shape extending in a diagonal direction with respect to each of the first direction DR1 and the second direction DR2, and the second line F-2 and the fourth line F-4 may have a curved shape with a curvature (e.g., a set or predetermined curvature).

The first line F-1 may be located between the first portion TP1 of one second hole HL-T and the first portion CP1 of the third hole HL-C.

The second line F-2 may be located adjacent to a convex portion of the first portion CP1 of the third hole HL-C. That is, the second line F-2 may be located adjacent to the boundary between the center portion IN and the outer portion OM.

The third line F-3 may be located between the first portion CP1 of the third hole HL-C and the first portion TP1 of another second hole HL-T.

The fourth line F-4 may be located adjacent to a convex portion of the first portion TP1 of the another second hole HL-T. That is, the fourth line F-4 may be located adjacent to the edge ET of the outer portion OM.

Each of the first, second, and third outer lines BR1, BR2, and BR3 may have a shape in which the first, second, third, and fourth lines F-1, F-2, F-3, and F-4 are alternately arranged with each other in the second direction DR2.

Referring to FIG. 10, a width W of a portion located between the first portion TP1 of the second hole HL-T and the first portion CP1 of the third hole HL-C in the outer portion OM along a direction to which the third lines F-3 are spaced apart from each other may be equal to or greater than 0.2 mm (or about 0.2 mm) and equal to or smaller than 0.5 mm (or about 0.5 mm).

A center distance R from a center of a radius of curvature of a portion with a maximum curvature of the first portion TP1 of the second hole HL-T to the second outer line BR2 may be equal to or greater than 0.3 mm (or about 0.3 mm) and equal to or smaller than 0.8 mm (or about 0.8 mm).

The first lines F-1 may have an extension distance L in an extension direction of the first lines F-1 in the outer portion OM.

According to the present disclosure, a ratio of the extension distance L to the center distance R may be equal to or greater than 1 (or about 1). In addition, a ratio of the width W to the center distance R may be equal to or smaller than 0.5 (or about 0.5).

Hereinafter, an optimal ratio of the extension distance L to a center distance R and an optimal ratio of the width W to the center distance R will be described with reference to Table 1. An extension distance L and a width W of Table 1 are the same as described above, and the numerical data used in Table 1 below are in millimeters (mm). The calculation was rounded to two decimal places. For example, 0.62 is 0.6, and 0.26 is 0.3.

TABLE 1

| Numerical value | Data (mm) | | | | |
|---|---|---|---|---|---|
| Center distance (R) | 0.62 | 0.62 | 0.62 | 0.62 | 0.62 |
| Width (W) | 0.26 | 0.62 | 0.62 | 0.26 | 0.26 |
| Extension distance (L) | 0 | 0.26 | 0.62 | 0.26 | 0.62 |
| Extension distance (L)/center distance (R) | 0 | 0.5 | 1 | 0.5 | 1 |
| Width (W)/center distance (R) | 0.5 | 1 | 1 | 0.5 | 0.5 |

TABLE 1-continued

| Numerical value | Data (mm) | | | | |
|---|---|---|---|---|---|
| Tensile modulus (Mpa) of folding portion(DTM-F) | 5.83 | 5.85 | 4.48 | 3.07 | 2.29 |
| Folding reliability | 0% | 25% | 50% | 75% | 100% |

Referring to Table 1, when the center distance R is 0.62 mm and the width W is 0.26 mm that is a half of the center distance R, a value obtained by dividing the width W by the center distance R may be 0.5. When the center distance R is 0.62 mm and the extension distance L has the same value, i.e., 0.62 mm, as the center distance R, a value obtained by dividing the extension distance L by the center distance R may be 1. When the value obtained by dividing the width W by the center distance R is 0.5 and the value obtained by dividing the extension distance L by the center distance R is 1, the tensile modulus of the folding portion DTM-F may have the smallest value of 2.29 Mpa. According to the present disclosure, as the extension distance L, the center distance R, and the width W of the second holes HL-T and the third holes HL-C located in the outer portion OM are set to have the optimal ratio, instances of cracks occurring in the outer lines located in the outer portion OM during the folding operation may be prevented or reduced. Accordingly, the digitizer DTM included in the electronic device ED may have relatively improved sensing sensitivity.

In addition, as the first, second, and third outer lines BR1, BR2, and BR3 are located on at least three base layers among the base layers BG, BU1, BU2, and BB1 in the outer portion OM of the digitizer DTM, the sensing sensitivity of the folding portion DTM-F may be relatively improved.

For example, the defects occurring when the outer lines are placed in the center portion IN instead of being located in the outer portion OM due to a narrow space of the outer portion OM and resulting in different sensing sensitivities between the outer portion OM and the center portion IN may be relatively improved.

FIGS. 11A to 11D are plan views of portions of the digitizer according to some embodiments of the present disclosure. FIGS. 11A to 11D show the outer lines OL (refer to FIG. 9) located on the base layers BG, BU1, BU2, and BB1 included in the base portion BM described with reference to FIG. 6A for each layer. Hereinafter, outer lines, second holes, and third holes of FIGS. 11A to 11D may correspond to the outer line OL, the second holes HL-T, and the third holes HL-C described with reference to FIG. 9.

Figure 11A:
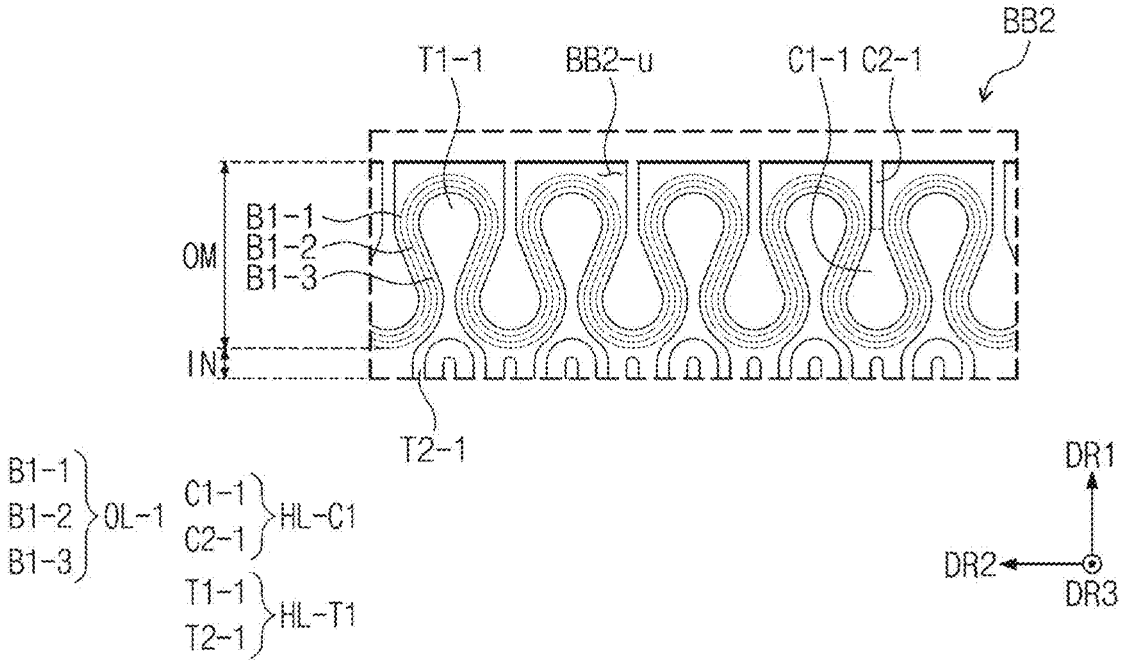
FIGS. 11A to 11D are plan views of a portion of a digitizer according to some embodiments of the present disclosure.

Referring to FIG. 11A, a first outer line OL-1 may be located on a second lower base layer BB2. The first outer line OL-1 may include first-first, first-second, and first-third lines B1-1, B1-2, and B1-3. The first-first, first-second, and first-third lines B1-1, B1-2, and B1-3 may be located on an upper surface BB2-*u* of the second lower base layer BB2.

The second lower base layer BB2 may include second-first holes HL-T1 and third-first holes HL-C1 arranged spaced apart from each other in the second direction DR2. Each of the second-first holes HL-T1 may include a first portion T1-1 and a second portion T2-1. Each of the third-first holes HL-C1 may include a first portion C1-1 and a second portion C2-1. The second-first holes HL-T1 and the third-first holes HL-C1 may correspond to holes defined through the second lower base layer BB2 among the second holes HL-T and the third holes HL-C described with reference to FIG. 9.

The first-first, first-second, and first-third lines B1-1, B1-2, and B1-3 may be located between the second-first holes HL-T1 and the third-first holes HL-C1 in an outer portion OM.

Figure 11B:
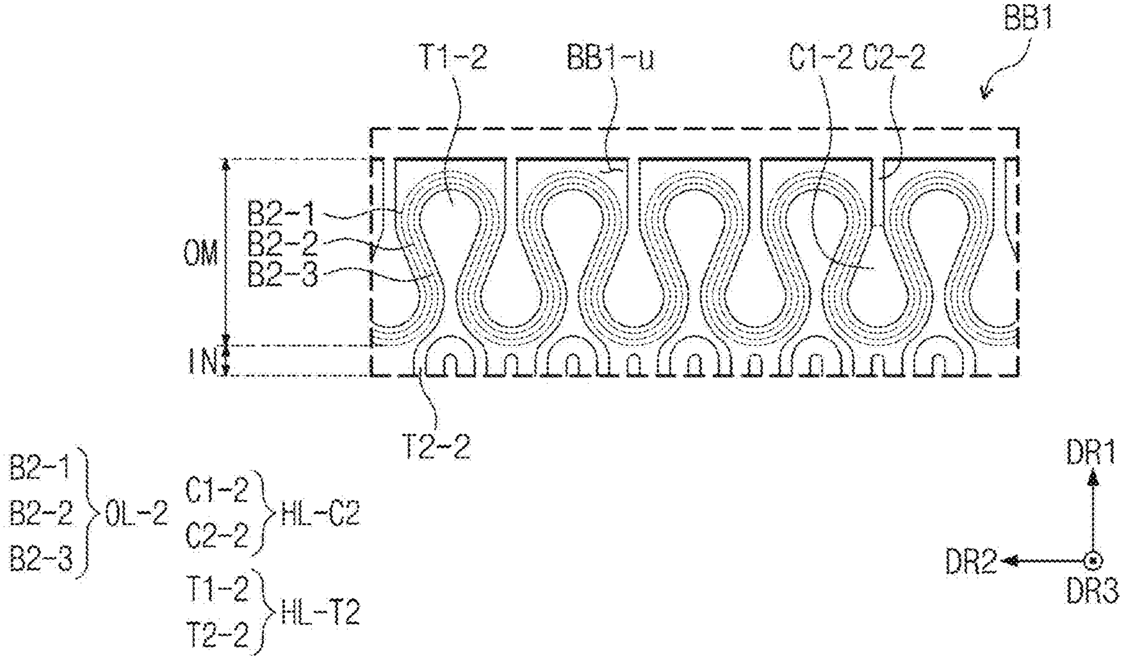

Referring to FIG. 11B, a second outer line OL-2 may be located on a first lower base layer BB1. The second outer line OL-2 may include second-first, second-second, and second-third lines B2-1, B2-2, and B2-3. The second-first, second-second, and second-third lines B2-1, B2-2, and B2-3 may be located on an upper surface BB1-*u* of the first lower base layer BB1.

The first lower base layer BB1 may include second-second holes HL-T2 and third-second holes HL-C2 arranged spaced apart from each other in the second direction DR2. Each of the second-second holes HL-T2 may include a first portion T1-2 and a second portion T2-2. Each of the third-second holes HL-C2 may include a first portion C1-2 and a second portion C2-2. The second-second holes HL-T2 and the third-second holes HL-C2 may correspond to holes defined through the first lower base layer BB1 among the second holes HL-T and the third holes HL-C described with reference to FIG. 9.

The second-first, second-second, and second-third lines B2-1, B2-2, and B2-3 may be located between the second-second holes HL-T2 and the third-second holes HL-C2 in an outer portion OM.

Figure 11C:
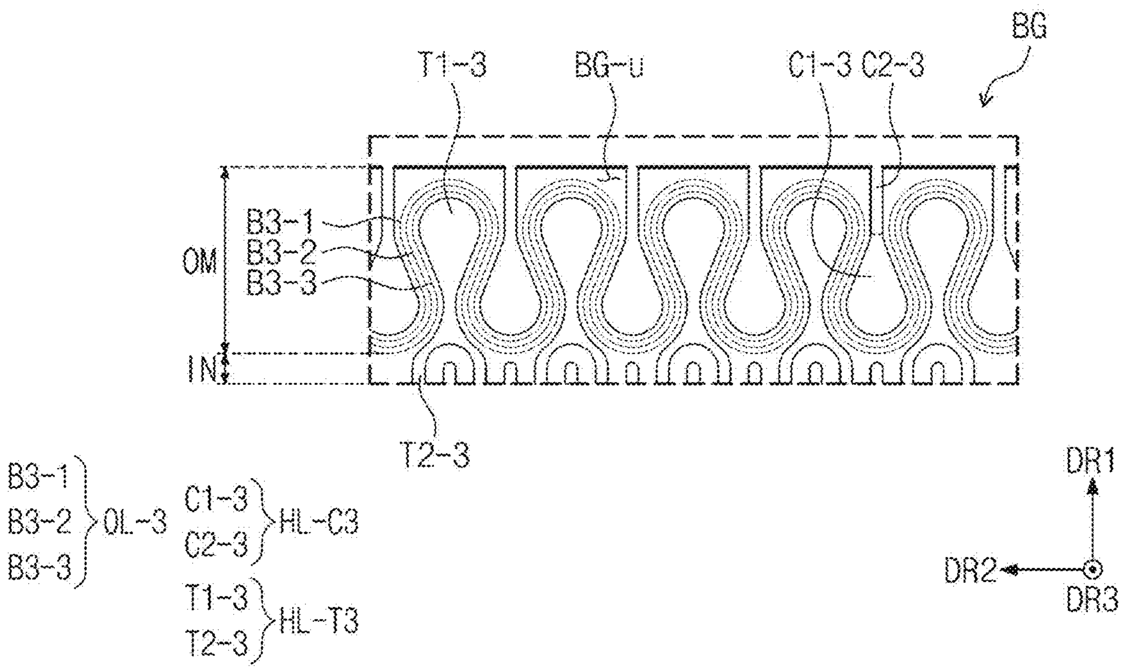

Referring to FIG. 11C, a third outer line OL-3 may be located on a base layer BG. The third outer line OL-3 may include third-first, third-second, and third-third lines B3-1, B3-2, and B3-3. The third-first, third-second, and third-third lines B3-1, B3-2, and B3-3 may be located on an upper surface BG-u of the base layer BG.

The base layer BG may include second-third holes HL-T3 and third-third holes HL-C3 arranged spaced apart from each other in the second direction DR2. Each of the second-third holes HL-T3 may include a first portion T1-3 and a second portion T2-3. Each of the third-third holes HL-C3 may include a first portion C1-3 and a second portion C2-3. The second-third holes HL-T3 and the third-third holes HL-C3 may correspond to holes defined through the base layer BG among the second holes HL-T and the third holes HL-C described with reference to FIG. 9.

The third-first, third-second, and third-third lines B3-1, B3-2, and B3-3 may be located between the second-third holes HL-T3 and the second-third holes HL-T3 in an outer portion OM.

Figure 11D:
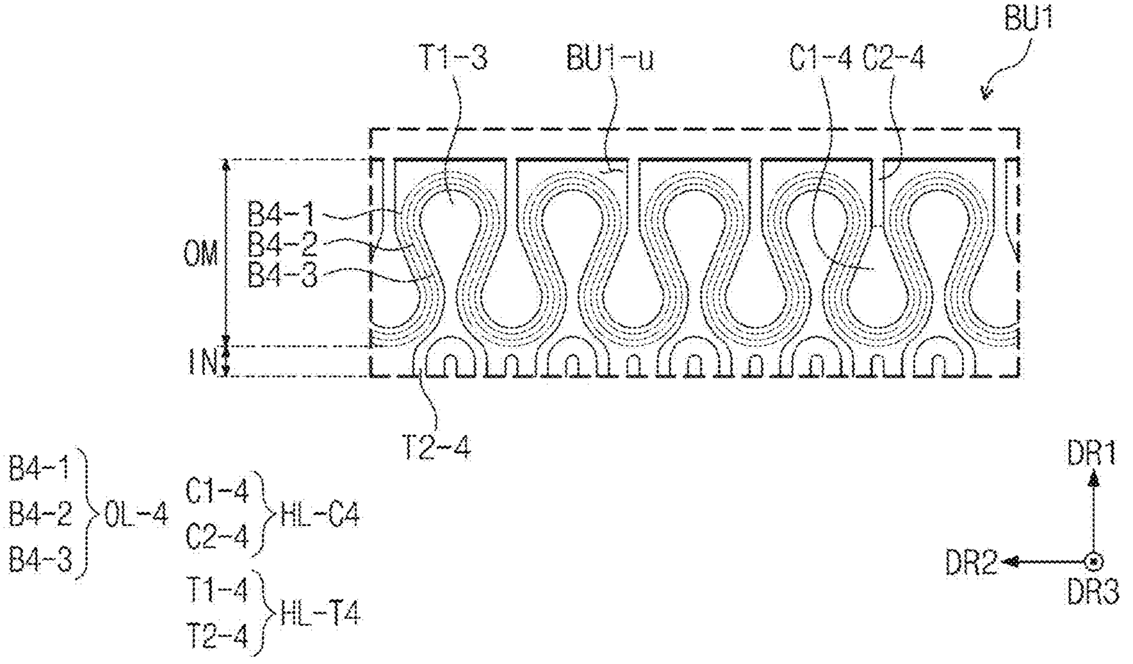

Referring to FIG. 11D, a fourth outer line OL-4 may be located on a first upper base layer BU1. The fourth outer line OL-4 may include fourth-first, fourth-second, and fourth-third lines B4-1, B4-2, and B4-3. The fourth-first, fourth-second, and fourth-third lines B4-1, B4-2, and B4-3 may be located on an upper surface BU1-*u* of the first upper base layer BU1.

The first upper base layer BU1 may include second-fourth holes HL-T4 and third-fourth holes HL-C4 spaced apart from each other in the second direction DR2. Each of the second-fourth holes HL-T4 may include a first portion T1-4 and a second portion T2-4. Each of the third-fourth holes HL-C4 may include a first portion C1-4 and a second portion C2-4. The second-fourth holes HL-T4 and the third-fourth holes HL-C4 may correspond to holes defined through the first upper base layer BU1 among the second holes HL-T and the third holes HL-C described with reference to FIG. 9.

The fourth-first, fourth-second, and fourth-third lines B4-1, B4-2, and B4-3 may be located between the second-fourth holes HL-T4 and the third-fourth holes HL-C4 in an outer portion OM.

The outer lines described with reference to FIGS. 11A to 11D may overlap each other. In addition, the outer line placed on one of the base layers BG, BU1, BU2, and BB1 may be omitted as long as at least nine lines are placed in the outer portion OM. In addition, at least one line of the three lines located in the outer line may be omitted as long as at least nine lines are placed in the outer portion OM, however, the present disclosure should not be limited thereto or thereby.

Although aspects of some embodiments of the present disclosure have been described, it is understood that the present disclosure should not be limited to these embodiments but various changes and modifications can be made by one ordinary skilled in the art within the spirit and scope of embodiments according to the present disclosure as defined in the appended claims, and their equivalents.

Therefore, the disclosed subject matter should not be limited to any single embodiment described herein, and the scope of embodiments according to the present disclosure shall be determined according to the attached claims, and their equivalents.

What is claimed is:

1. An electronic device comprising:

a display module comprising an active area configured to display an image and a peripheral area adjacent to the active area; and a digitizer under the display module, comprising a folding portion configured to be folded with respect to a folding axis extending in a first direction, a first non-folding portion, and a second non-folding portion spaced apart from the first non-folding portion with the folding portion interposed therebetween in a second direction intersecting the first direction, and comprising a base portion and sensing coils in the base portion, the folding portion comprising:

a center portion comprising first holes and overlapping the active area; and an outer portion extending from the center portion toward a direction parallel to the first direction and comprising second holes each comprising a first portion and a second portion and third holes each comprising a first portion and a second portion, the second and third holes having different shapes and alternately arranged with each other in the second direction, wherein the first portion of each of the second holes has a convex shape in a direction away from the center portion in a plan view, and the first portion of each of the third holes has a convex shape in a direction approaching the center portion in the plan view, wherein the second portion of each of the second holes surrounds a portion of a first hole from among the first holes that is adjacent to a boundary between the center portion and the outer portion.

2. The electronic device of claim 1, wherein the second portion of each of the third holes is at an edge of the outer portion to define an open opening.

3. The electronic device of claim 2, wherein a width between side surfaces of the outer portion, which define the second portion of each of the third holes, is uniform in the second direction.

4. The electronic device of claim 1, wherein the first holes comprise:

first group holes extending in the first direction and arranged in the second direction; and second group holes alternately arranged with the first group holes, shifted from the first group holes to the first direction, extending in the first direction, and arranged in the second direction.

5. The electronic device of claim 1, wherein the sensing coils comprise non-folding coils in the first non-folding portion and the second non-folding portion, center lines in the center portion, and outer lines in the outer portion, each of the outer lines comprises a first line that is linear, a second line with a predetermined curvature, a third line that is linear, and a fourth line with a predetermined curvature, the first line is between the first portion of one second hole among the second holes and the first portion of one third hole among the third holes, the second line is adjacent to a convex portion of the first portion of the third hole, the third line is between the first portion of the one third hole among the third holes and the first portion of another second hole among the second holes, and the fourth line is adjacent to a convex portion of the first portion of the second hole.

6. The electronic device of claim 5, wherein a width of a portion between the first portion of the second hole and the first portion of the third hole in the outer portion along a direction to which the outer lines are spaced apart from each other is equal to or greater than 0.2 millimeters (mm) and equal to or smaller than 0.5 mm.

7. The electronic device of claim 6, wherein the outer lines comprise first, second, and third outer lines spaced apart from each other and sequentially arranged, and a center distance from a center of a radius of curvature of a portion with a maximum curvature of the first portion of the second hole to the second outer line is equal to or greater than 0.3 mm and equal to or smaller than 0.8 mm.

8. The electronic device of claim 7, wherein a portion of the outer portion on which the first line is located, which is linear, has an extension distance in a direction in which the first line extends, and a ratio of the extension distance to the center distance is equal to or greater than 1.

9. The electronic device of claim 7, wherein a ratio of the width to the center distance is 0.5.

10. The electronic device of claim 5, wherein the base portion comprises:

a base layer comprising an upper surface facing the display module and a lower surface opposite to the upper surface;

a first upper base layer on the upper surface of the base layer;

a second upper base layer on an upper surface of the first upper base layer;

a first lower base layer on the lower surface of the base layer; and a second lower base layer on a lower surface of the first lower base layer.

11. The electronic device of claim 10, wherein the outer lines are on at least three layers among the second lower base layer, the first lower base layer, the base layer, and the first upper base layer.

12. The electronic device of claim 11, wherein the outer lines on one of the second lower base layer, the first lower base layer, the base layer, and the first upper base layer comprise first, second, and third lines spaced apart from each other and sequentially arranged, and at least nine outer lines are in the outer portion.

13. The electronic device of claim 10, wherein each of the sensing coils comprises one of copper, and each of the second lower base layer, the first lower base layer, the base layer, the first upper base layer, and the second upper base layer comprises a matrix comprising a filler and a reinforced fiber composite in the matrix and comprising one of a glass fiber and a carbon fiber.

14. The electronic device of claim 13, wherein the matrix comprises at least one of epoxy, polyester, polyamide, polycarbonate, polypropylene, polybutylene, or vinyl ester, and the filler comprises at least one of silica, barium sulphate, sintered talc, barium titanate, titanium oxide, clay, alumina, mica, boehmite, zinc borate, or zinc tin oxide.

15. The electronic device of claim 10, wherein each of the non-folding coils forms an open loop that rotates at least twice.

16. The electronic device of claim 15, wherein portions of the non-folding coils which rotate twice and intersect each other are connected to a bridge pattern on a different layer among the second lower base layer, the first lower base layer, the base layer, the first upper base layer, and the second upper base layer through a contact hole.

17. The electronic device of claim 15, wherein two center lines are between the first holes adjacent to each other in the plan view.

18. The electronic device of claim 1, wherein the display module comprises:

a display panel configured to display the image; and an input sensor directly on the display panel and configured to sense an external input by a capacitive method.

19. The electronic device of claim 1, wherein the digitizer is configured to sense an external input by an electromagnetic resonance method.

* * * * *